(12) United States Patent
Priewasser et al.

(10) Patent No.: US 8,578,238 B2
(45) Date of Patent: Nov. 5, 2013

(54) ASIP ARCHITECTURE FOR EXECUTING AT LEAST TWO DECODING METHODS

(75) Inventors: Robert Priewasser, Klagenfurt (AT); Bruno Bougard, Jodoigne (BE); Frederik Naessens, Roeselaere (BE)

(73) Assignees: IMEC, Leuven (BE); Samsung Electronics Co., Ltd., Suwon-si, Gyeonggi-do (KR)

( * ) Notice: Subject to any disclaimer, the term of this patent is extended or adjusted under 35 U.S.C. 154(b) by 797 days.

(21) Appl. No.: 12/752,944

(22) Filed: Apr. 1, 2010

(65) Prior Publication Data
US 2010/0268918 A1  Oct. 21, 2010

Related U.S. Application Data

(63) Continuation of application No. PCT/EP2008/063259, filed on Oct. 2, 2008.

(60) Provisional application No. 60/977,036, filed on Oct. 2, 2007.

(51) Int. Cl.
*H03M 13/00* (2006.01)

(52) U.S. Cl.
USPC ............... 714/758; 714/798; 714/762

(58) Field of Classification Search
USPC ........... 714/758, 798, 789, 762, 761, 735, 27, 714/15
See application file for complete search history.

(56) References Cited

U.S. PATENT DOCUMENTS

| | | | | |
|---|---|---|---|---|
| 5,805,632 | A * | 9/1998 | Leger | 375/282 |
| 6,658,758 | B2 * | 12/2003 | Kahl et al. | 34/117 |
| 7,646,318 | B2 * | 1/2010 | Lee et al. | 341/67 |
| 7,669,042 | B2 * | 2/2010 | Pisek et al. | 712/241 |

OTHER PUBLICATIONS

International Preliminary Report on Patentability dated Feb. 8, 2010 for International Application No. PCT/EP2008/063259.
International Search Report and Written Opinion dated Jun. 30, 2009 for International Application No. PCT/EP2008/063259.
Bahl, L.R. et al., Optimal Decoding of Linear Codes for Minimizing Symbol Error Rate, IEEE Transactions on Information Theory, 20(2):284-287 (Mar. 1974).
Bajot, Y. And Mehrez, H., Customizable DSP Architecture for ASIP Core Design, IEEE International Symposium on Circuits and Systems, 2001, ISCAS 2001, 4:302-305 (May 6-9, 2001).
Beck, M., Ethernet in the First Mile, the IEEE 802.3ah EFM Standard, The McGraw-Hill Companies, Inc. pp. 86-87 (2005).

(Continued)

*Primary Examiner* — Fritz Alphonse
(74) *Attorney, Agent, or Firm* — Knobbe Martens Olson & Bear LLP

(57) ABSTRACT

A system for execution of a decoding method is disclosed. The system is capable of executing at least two data decoding methods which are different in underlying coding principle, wherein at least one of the data decoding methods requires data shuffling operations on the data. In one aspect, the system includes at least one application specific processor having an instruction set having arithmetic operators excluding multiplication, division and power. The processor is selected for execution of approximations of each of the at least two data decoding methods. The system also includes at least a first memory unit, e.g. background memory, for storing data. The system also includes a transfer unit for transferring data from the first memory unit towards the at least one programmable processor. The transfer unit includes a data shuffler. The system may also include a controller for controlling the data shuffler independent from the processor.

20 Claims, 21 Drawing Sheets

(56) References Cited

OTHER PUBLICATIONS

Bickerstaff, M. et al., A 24Mb/s Radix-4 LogMAP Turbo Decoder for 3GPP-HSDPA Mobile Wireless, ISSCC 2003 / Session 8 / Communications Signal Processing / Paper 8.5, 10 pp. (Feb. 2003).

Bougard, B. et al., A Scalable 8.7nJ/bit 75.6Mb/s Parallel Concatenated Convolutional (Turbo-) CODEC, ISSCC 2003 / Session 8 / Communications Signal Processing /Paper 8.6, 10 pp. (Feb. 2003).

Dinoi, L. et al., ASIP design for partially structured LDPC codes, Electronic Letters, 42(18), 2 pp. (Aug. 31, 2006).

Fossorier, M. et al., Reduced Complexity Iterative Decoding of Low-Density Parity Check Codes Based on Belief Propagation, IEEE Transactions on Communications, 47(5):673-680 (May 1999).

Gallager, Low-Density Parity-Check Codes, IRE Transactions on Information Theory, pp. 21-28 (1962).

Giulietti, A. et al., Demystifying the Fang-Buda Algorithm, Chapter 4, from TURBO CODES Desirable and Designable, Kluwer Academic Publishers, pp. 81-104 (2004).

Giulietti, A. et al., Parallel turbo coding interleavers: avoiding collisions in accesses to storage elements, Electronic Letters, 38(5):232-234 (Feb. 2002).

Gschwind, M., Instruction Set Selection for Asip Design, Proceedings of the $7^{th}$ International Workshop on Hardware/Software Codesign (CODEC '99), pp. 7-11 (May 3-5, 1999).

Hocevar, D.E., A Reduced Complexity Decoder Architecture Via Layered Decoding of LDPC Codes, 2004 IEEE Workshop on Signal Processing Systems Design and Implementation Proceedings (SIPS 2004), pp. 107-112 (Oct. 2004).

Mansour, M.M. and Shanbhag, N. R., Memory-Efficient Turbo Decoder Architectures for LDPC Codes, IEEE Workshop on Signal Processing Systems SIPS, pp. 159-164 (Oct. 2002).

Mansour, M.M. and Shanbhag, N. R., Turbo Decoder Architectures for Low-Density Parity-Check Codes, Global Telecommunications Conference, 2002. GLOBCOM '02. IEEE, 2:1383-1388 (Nov. 17-21, 2002).

Tarable, A. et al., Mapping Interleaving Laws to Parallel Turbo and LDPC Decoder Architectures, IEEE Transactions on Information Theory, 50(9):2002-2009 (Sep. 2004).

Zarkeshvari, F. and Banihashemi, A., On Implementation of Min-Sum Algorithm for Decoding Low-Density Parity-Check (LDPC) Codes, Global Telecommunications Conference, 2002. GLOBECOM '02. IEEE, 2:1349-1353 (Nov. 17-21, 2002).

* cited by examiner

Table 1 : Instruction set architecture

| Slot | Group | Instruction | Usage | Semantic | |
|---|---|---|---|---|---|
| scalar | alu | and,or,xor | [INSTR] [_src_reg1] [_src_reg2] [_dest_reg] | _dest_reg = _src_reg1 {&,|,^} _src_reg2 | Basic logic operations |
| scalar | alu | andi,ori,xori | [INSTR] [_src_reg] [_imm16] [_dest_reg] | _dest_reg = _src_reg1 {&,|,^} _imm16 | |
| scalar | alu | add, sub | [INSTR] [_src_reg1] [_src_reg2] [_dest_reg] | _dest_reg = _src_reg1 {+,-} _src_reg2 | Basic arithmetic operations |
| scalar | alu | addi, subi | [INSTR] [_src_reg1] [_imm16] [_dest_reg] | _dest_reg = _src_reg1 {+,-} _imm16 | |
| scalar | alu | mov, not | [INSTR] [_src_reg1] [_dest_reg] | _dest_reg {=,=!} _src_reg | |
| scalar | alu | sl, sr | [INSTR] [_src_reg1] [_src_reg2] [_dest_reg] | _dest_reg = _src_reg1 {<<,>>} _src_reg2 | Shift left/right |
| scalar | alu | sli, sri | [INSTR] [_src_reg1] [_imm16] [_dest_reg] | _dest_reg = _src_reg1 {<<,>>} _imm16 | |
| scalar | alu | movli, movhi | [INSTR] [_imm16] [_reg] | _reg = (_reg&0xFFFF0000) | _imm16<br>_reg = (_reg&0x0000FFFF) | (_imm16<<16) | |
| scalar | branch | blt, bne | [INSTR] [_src_reg1] [_src_reg2] [_label] | Jump to _label is _src_reg1 {<,!=} _src_reg2 | |
| scalar | branch | jmp | [INSTR] [_label] | Jump to _label | |
| vector | vls | vld | [INSTR] [_reg] [_imm3] [_vreg] | _vreg = mem(virt_addr=_reg,bank=_imm3) | |
| vector | vls | vldi,vldb | [INSTR] [_imm16] [_imm3] [_vreg] | _vreg=mem({virt_addr,addr}=_imm16,bank=_imm3) = _vreg | |
| vector | vls | vst | [INSTR] [_reg] [_imm3] [_vreg] | mem(virt_addr=_reg,bank=_imm3) = _vreg | |
| vector | vls | vsti, vstb | [INSTR] [_imm16] [_imm3] [_vreg] | mem({virt_addr,addr}=_imm16,bank=_imm3)=_vreg | |
| vector | vscratch | vild | [INSTR] [_reg] [_vreg] | _vreg = scratchpad_mem(addr=_reg) | |
| vector | vscratch | vist | [INSTR] [_reg] [_vreg] | scratchpad_mem(addr=_reg) = _vreg | |
| vector | vstack | vpop,vpush | [INSTR] [_vreg] | | |
| vector | varith | vadd,vsub,vxor | [INSTR] [_src_vreg1] [_src_vreg2] [_dest_vreg] | _dest_vreg = _src_vreg1 {+,-,^} _src_vreg2 | |
| vector | varith | vabs | [INSTR] [_src_vreg] [_dest_vreg] | _dest_vreg = abs(_src_vreg) | |
| vector | varith | vmax | [INSTR] [_src_vreg1] [_src_vreg2] [_dest_vreg] | _dest_vreg = max(_src_vreg1, _src_vreg2) | |
| vector | varith | vmaxstar | [INSTR] [_src_vreg1] [_src_vreg2] [_dest_vreg] | max* based approximation for check node computation based on [11] applied on _src_vreg1 and _src_vreg2, result stored in _dest_vreg | |
| vector | varith | vminsum | [INSTR] [_src_vreg1] [_src_vreg2] [_dest_vreg] | Min-sum based approximation applied on _src_vreg1 and _src_vreg2, result stored in _dest_vreg | |
| vector | varith | vsli,vsri | [INSTR] [_src_vreg] [_imm10] [_dest_vreg] | _dest_vreg = _src_vreg {<<,>>} _imm16 | |
| vector | vmani | vvsl,vvsr | [INSTR] [_vreg] | _vreg = {_vreg(2:end) & 0, 0 & _vreg(1:end-1)} | |
| vector | vmani | vset, vseti | [INSTR] [{_reg,_imm10}] [_vreg] | _vreg(1:end) = {_reg,_imm10} | |
| vector | vmani | vedit,vediti | [INSTR] [_imm7] [{_reg,_imm10}] [_vreg] | _vreg(_imm7) = {_reg,_imm10} | |
| vector | vmani | vgrep | [INSTR] [_reg] [_src_vreg] [_dest_reg] | _dest_reg = _src_vreg(_reg) | |

Fig. 15

ASIP ARCHITECTURE FOR EXECUTING AT LEAST TWO DECODING METHODS

CROSS REFERENCE TO RELATED APPLICATIONS

This application is a continuation of PCT Application No. PCT/EP2008/063259, filed on Oct. 2, 2008, which claims priority under 35 U.S.C. §119(e) to U.S. provisional patent application 60/977,036 filed on Oct. 2, 2007. Each of the above applications is incorporated by reference hereby in its entirety.

BACKGROUND OF THE INVENTION

1. Field of the Invention

The present invention relates to high-speed and low power data decoding in communication systems, and to decoders providing such decoding. The present invention relates to semi-automated methods for exploration of data decoding methods, to approximations for data decoding methods and/or instruction sets delivered by such methods, to application specific instruction set processors (ASIPs) capable of executing instructions of such instruction sets, to systems for execution of decoding methods and to methods for executing decoding methods.

2. Description of the Related Technology

In digital communication systems, reliable transmission is achieved by means of channel coding, a class of forward error correction (FEC) techniques. Coding the information means adding redundancy to the bit stream at the transmitter side, so that it can be properly reproduced at the receiver side.

Nowadays, mobile devices are integrating an increasing variety of wireless communication and connectivity standards, each depicting a multitude of operation modes. This diversity, combined with the increasing cost of semiconductor, e.g. silicon, implementation claims for flexible implementations wherever possible.

A software defined radio (SDR) system is a radio communication system where components, such as e.g. mixers, filters, amplifiers, modulators/demodulators, detectors etc., that have typically been implemented in hardware are instead implemented using software on a processor of a personal computer or other embedded computing device. Significant amounts of signal processing are handed over to the processor, rather than being done using special-purpose hardware. The Tier-2 SDR approach, where the whole baseband functionality is run on a programmable architecture, is an attractive way to obtain the above flexibility. Great advances were recently booked in SDR for mobile applications. Multiple SDR processors have been proposed, covering most of the baseband processing with satisfactory performance and energy efficiency. In some cases, forward error correction is implemented on the same processor as the rest of the baseband.

More recent developments have been tackling high throughput communication standards such as IEEE 802.11n and 3GPP LTE. However, as it typically depicts a magnitude higher computation load, forward error correction (FEC) has been excluded from the scope of most of these high throughput solutions and lead to separate dedicated hardware accelerators. Lots of research is being carried out about efficient implementation of such hardware accelerators.

The number of advanced FEC options for broadband communication standard is, however, also growing rapidly. Besides 3GPP where convolutional turbo codes are used for a while, the IEEE adopted low-density parity-check (LDPC) coding schemes as optional for the third WLAN generation (IEEE 802.11n) as well as for fixed broadband wireless access (IEEE 802.16a) and their mobility extension (IEEE 802.16e). IEEE 802.16 also consider convolutional and block turbo codes as other optional schemes. Advanced forward error correction is also getting popular in broadcast standards. For instance, LDPC is used in DVB-S2/T2. Although these applications have a lower channel throughput, high throughput implementations are still required to enable multi-channel viewing and recording in set-top-boxes.

Flexibility is hence required for advanced FEC too. To address this need, recent contributions were looking at application specific instruction set processor (ASIP) implementations These solutions enable running different kind of turbo codes as well as Viterbi decoding on the same processor. In case of LDPC, advances were presented in offering flexibility by combining checknode processing with an interconnection network.

However, no application specific architecture has been presented yet that allows one to map both turbo and LDPC decoding at high throughput, with full memory architecture sharing, full data-path reuse and high energy efficiency.

SUMMARY OF CERTAIN INVENTIVE ASPECTS

Certain inventive aspects relate to an application specific programmable architecture addressing in a unified way the emerging turbo- and LPDC coding requirements of 3GPP-LTE, IEEE802.11n, IEEE802.16(e). It is an advantage of certain embodiments of the present invention that extension to DVB-S2 is also possible.

In one aspect, the present invention provides a semi-automated method for exploration of data decoding methods whereby at least one of the data decoding methods requires data shuffling operations on the data. The method according to embodiments of the present invention comprises loading at least two decoding methods which are different in underlying coding principle, such as for example one type of LDPC decoding method and one type of turbo decoding method. It further comprises loading a template of an ASIP device having a memory structure and an ASIP core with a pre-defined instruction set, and changing the codes of each of the decoding methods into one or more fixed point approximations making use of the pre-defined instruction set. The method further comprises selecting for each of the decoding methods one approximation and scheduling of the data accesses to the memory structure, the selecting and the scheduling being by evaluating the performance of the execution of each of the approximations on the device, the performance including throughput and power consumption by the ASIP core and the power consumption due to data accesses to the memory structure. The method further comprises delivering the selected approximations of the at least two decoding methods and providing the selected scheduling.

In a semi-automated method according to embodiments of the present invention, the approximations may comprise arithmetic operations excluding multiplication, division and power. Hence only simple operations are used, no complex operations as floating point operations, multiplication, division, power. The arithmetic operations may comprise instructions selected from the group consisting of (max, min, sum, subtraction).

A method according to embodiments of the present invention may furthermore comprise exploration of different templates of an ASIP device. This involves first loading a first template of an ASIP device having a first memory structure and a first ASIP core with a pre-defined first instruction set, changing the codes of each of the decoding methods into one or more fixed point approximations making use of the predefined first instruction set, then loading at least a second template of an ASIP device having a second memory structure and a second ASIP core with a second pre-defined instruction set, at least one of the second memory structure and the second ASIP core being different from the first memory structure and the first ASIP core, respectively, changing the codes of each of the decoding methods into one or more fixed point approximations making use of the predefined second instruction set, selecting a template of an ASIP device common for both decoding methods, and selecting for each of the decoding methods one approximation, and scheduling of the data accesses to the memory structure of the selected ASIP device, the selecting and the scheduling being as indicated above, and delivering the selected template of the ASIP device, the selected approximations of the at least two decoding methods and providing the selected scheduling.

In another aspect, the present invention provides an approximation for a data decoding method, obtained by a method according to method embodiments of the present invention.

In another aspect, the present invention provides a semi-automated method for exploration of decoding methods and an instruction set suitable therefor. The method comprises loading at least two decoding methods which are different in underlying coding principle, loading a template of an ASIP device with a plurality of possible instruction sets, changing the codes of each of the decoding methods into a plurality of fixed point approximations making use of the instruction sets. It may further comprise selecting for each of the decoding methods one approximation and the corresponding instruction set by evaluating the performance of the execution of each of the approximations on the device, the selected instruction set being the same for the at least two decoding methods. It may further comprise delivering the selected approximations of the at least two decoding methods and the corresponding instruction set.

In a further aspect, the present invention provides an instruction set delivered by a method according to an embodiment of the present invention. The Instruction set may comprise arithmetic operators excluding multiplication, division and power. The arithmetic operators may comprise any of max* or min+(min-sum).

In another aspect, the present invention provides an application specific processor capable of executing instructions of an instruction set according to embodiments of the present invention.

In yet another aspect, the present invention provides a system for execution of a decoding method, the system being capable of executing at least two data decoding methods which are different in underlying coding principle, whereby at least one of the data decoding methods requires data shuffling operations on the data. A system according to embodiments of the present invention comprises—at least one ASIP core, i.e. an application specific programmable processor, having an instruction set comprising arithmetic operators excluding multiplication, division and power, the ASIP core being selected for execution of approximations of each of the at least two data decoding methods. It may further comprise at least a first memory unit, e.g. background memory, for storing data, a transfer unit for transferring data from the first memory unit towards the at least one ASIP core, the transfer unit including a data shuffler, and a controller for controlling the data shuffler independent from the ASIP core.

It is not obvious for a person skilled in the art to choose to use an ASIP core for decoding at least two data decoding methods which are different in underlying coding principle, whereby at least one of the data decoding methods requires data shuffling operations on the data, and to at the same time separately control, by a separate controller, the data shuffling. According to embodiments of the present invention, this independency between the ASIP core for decoding and the controller for shuffling is selected on purpose.

According to embodiments of the present invention, the controller may comprise an AGU (address generator unit).

The at least two different data decoding methods may include one or more of LDPC or turbo decoding, e.g. one of convolutional or block turbo decoding.

A system according to embodiments of the present invention may comprise a plurality of ASIP cores. This allows parallelization of decoding, hence an increase in decoding speed.

A system according to embodiments of the present invention may comprise a plurality of first memory units and a plurality of data shufflers. This is particularly advantageous in case LDPC decoding requiring high parallelization is to be handled. The transfer unit may further comprise a data rotation engine. This is also very advantageous for handling LDPC decoding requiring high parallelization.

In a system according to embodiments of the present invention, the at least one ASIP core may be adapted by provision of dedicated instructions for executing all the at least two different data decoding methods. This adaptation may comprise providing the ASIP with an instruction set according to embodiments of the present invention.

In a system according to embodiments of the present invention, the ASIP core is adapted so that the at least two different data decoding methods use the same datapath.

In a further aspect, the present invention provides the use of a system with at least one programmable ASIP core with dedicated instructions for executing a group of decoding methods which are different in underlying coding principle, the executions at least exploiting all the same of the at least one ASIP core. The group of decoding methods may at least comprise turbo decoding methods and LDPC decoding methods.

In yet another aspect, the present invention provides a method for decoding data. The method comprises loading an approximation of a decoding method, loading coded data, decoding the data by means of the approximation, wherein decoding the data comprises executing arithmetic operations on the coded data by means of a programmable ASIP core, and controlling scheduling of data accesses to a memory structure by a controller separate form the ASIP core.

The loaded approximation may be an approximation according to embodiments of the present invention.

Decoding the data may comprise executing arithmetic operations on the coded data by means of a plurality of parallel ASIP cores. Controlling scheduling of data accesses may comprise controlling of shuffling of data from a memory structure of the ASIP by a controller separate from the ASIP core. The controller may be adapted for controlling data accesses so as to be collision-free. This increases the throughput of the system.

In a further embodiment, the present invention provides a programmable processor, an ASIP core, capable of executing at least two decoding methods, approximations of the decoding methods being obtained by a method according to embodiments of the present invention, wherein the ASIP core stores dedicated instructions for the at least two decoding methods.

It is an advantage of embodiments of the present invention that a 100+Mbps throughput is achieved while providing significant area benefits when compared to the combination of dedicated turbo and LDPC solutions. Particular and preferred aspects of the invention are set out in the accompanying independent and dependent claims. Features from the dependent claims may be combined with features of the independent claims and with features of other dependent claims as appropriate and not merely as explicitly set out in the claims.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

BRIEF DESCRIPTION OF THE DRAWINGS

FIG. 15 is a table showing an instruction set according to an embodiment of the present invention.

Figure 1:
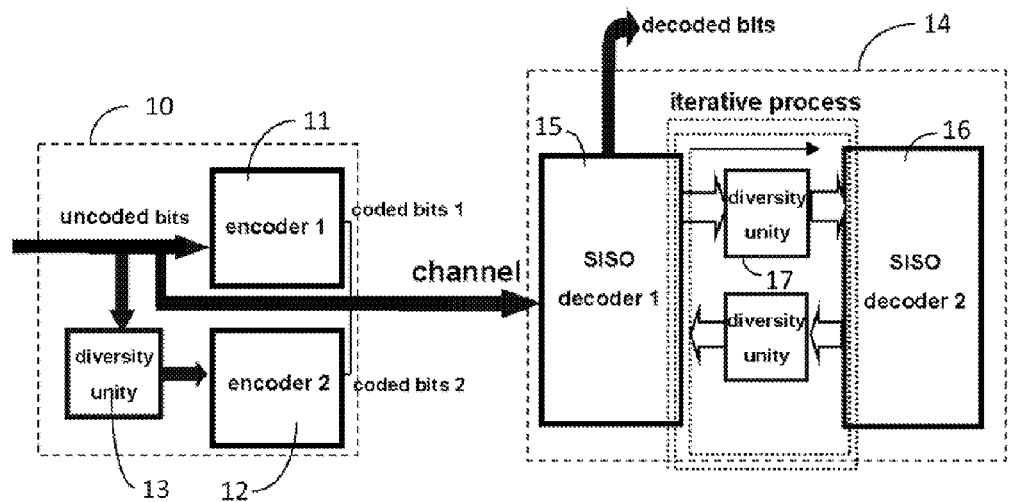
FIG. 1 is a schematic overview of the turbo decoding paradigm.

In the different figures, the same reference signs refer to the same or analogous elements.

DETAILED DESCRIPTION OF CERTAIN ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may do so. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments of the invention may be practiced without these specific details. In other instances, well-known methods, structures and techniques have not been shown in detail in order not to obscure an understanding of this description.

The invention will now be described by a detailed description of several embodiments of the invention. It is clear that other embodiments of the invention can be configured according to the knowledge of persons skilled in the art without departing from the technical teaching of the invention as defined by the appended claims. The detailed description starts off with an overview of the turbo decoding scheme and the LDPC decoding scheme, as two particular decoding schemes which can be used in an architecture according to the present invention. Of all practical error correction methods known to date, turbo codes and low-density parity-check codes (LDPC) come closest to approaching the Shannon limit, the theoretical limit of maximum information transfer rate over a noisy channel.

Turbo Decoding Algorithm Exploration

Introduction

In coding theory, concatenated codes form a class of error-correcting codes which are derived by combining an inner code and an outer code.

Turbo codes are a class of high-performance error correction codes which are finding use in deep space satellite communications and other applications where designers seek to achieve a maximal information transfer over a limited-bandwidth communication link in the presence of data-corrupting noise. Turbo codes, although not concatenated codes, do typically also utilize two different error correction codes in parallel.

What distinguishes Turbo codes from concatenated codes and what makes them so powerful, is the combination of three concepts:

Combination of codes,
Separate decoding of constituent codes with exchange of information, and
Iterative decoding.

A schematic overview of these three concepts into the turbo decoding paradigm is depicted on FIG. 1.

Turbo codes make it possible to increase data rate without increasing the power of a transmission, or they can be used to decrease the amount of power used to transmit at a certain data rate.

A turbo encoder 10 provides three sub-blocks of bits. The first sub-block is an k-bit block of payload data. The second sub-block comprises N–k/2 parity bits for the payload data, computed e.g. using a recursive systematic convolutional code (RSC code). The third sub-block also comprises N–k/2 parity bits, but for a known permutation of the payload data, again computed e.g. using an RSC convolutional code. This means that two redundant but different sub-blocks of parity bits are provided for the sent payload. The complete block sent has N bits of data with a code rate of k/N. In order to obtain this, a first encoder sub-block 11 and a second encoder sub-block 12 are provided. The permutation of the payload data is carried out by a device called interleaver 13.

The decoder 14 is built in a similar way as the above encoder 10: two elementary sub-decoders 15, 16 are interconnected to each other, but in serial way, not in parallel. The first sub-decoder 15 operates on lower speed, and is intended for the first encoder sub-block 11, and the second sub-decoder 16 is intended for the second encoder sub-block 12.

To represent the messages exchanged between the two sub-decoders 15, 16, it is not feasible anymore to only take the binary information, whether the received symbol is a '0' or a '1' (hard-decision). Not only the polarity of a bit is stored, but also a measurement of how confident this decision would be (soft-decision). Furthermore, these measurements are expressed as probabilities equal to ratios of the probability for the bit being one or zero. For the uncoded bits to be '1' or '0', under the condition that the sequence y was received, this a posteriori ratio can be written as $$\frac{Pr(u_k = 1 \mid y)}{Pr(u_k = 0 \mid y)}.$$

The sequence y is also denoted as $y^N_1 = y_1, y_2, \ldots, y_N$. The task of the decoder 14 is to estimate these a posteriori probabilities, where the received sequence $y = y^N_1$ consists of $d = d^k_1$ information bits (systematic part of the payload), $c^{(N-k)/2}_1$ control bits from the first constituent code, and $c'^{(N-k)/2}_1$ control bits from the second constituent code. The first sub-decoder 15 thus yields a soft decision which causes a first delay, corresponding to a same delay caused by a delay line in the encoder 11. The operation of the second sub-decoder 16 causes a second delay. An interleaver 17 installed between the first and second sub-decoders 15, 16 is used to scatter error bursts coming from the first sub-decoder output.

The BCJR algorithm [described by L. R. Bahl, F. Cocke, F. Jelinek, and J. Raviv, in "Optimal decoding of linear codes for minimizing symbol error rate", IEEE Trans. on Information Theory, pages 284-287, 1974, which is incorporated herein by reference] is an algorithm for maximum a posterior (MAP or posterior mode) decoding of error correcting codes defined on trellises. The symbol-by-symbol MAP decoding, implemented using the BCJR algorithm, performs optimal decoding by maximizing the a posteriori probabilities. In other words, it takes all possibilities of each bit in the received vector y into account and takes a decision for each bit as a last process (it minimizes the symbol, or bit error probability). When illustrated in a trellis diagram, all paths through the diagram need to be computed and considered for a decision. This forms an optimal decoding scheme, for the cost of complexity. To efficiently decode Turbo codes by using the BCJR algorithm, it needs to be tailored for this need and additional steps must be taken to allow an efficient implementation of a MAP decoder for Turbo codes. With reference to the trellis diagram, the decoder's task is to estimate the a posteriori probabilities for all states $S_k$ and all transitions between these states for a received vector $y^N_1=\{y_1, y_2, \ldots, y_N\}$ with N elements. Each element in the received vector y corresponds to the set of transitions from time k to time k+1, with k=0, . . . , N. The probability for being in a state m equals $$Pr(S_k=m|y_1^N)=\lambda_k(m)$$

This represents the probability, that under the condition that the sequence $y^N_1$ was received, the state at time k is m.

The same can be written for the probability of the transition from state m' to m:

$$Pr(S_{k-1}=m', S_k=m|y_1^N)=\sigma_k(m',m)$$

This is the probability, that under the condition that the sequence $y^N_i$ was received, the transition will be from state m' at time k−1 to state m at time k. This needs to be computed for all possible transitions. This computation can be split up in two parts. In the first part, called the forward, or α recursion, the probabilities of being in a specific state, taking all previous transition probabilities into account, are computed for all states. The same is done for the second part, in the backward, or β recursion, where the same probabilities are computed starting from the last state.

Decoding Algorithm Approximation

The equality of $$\max(x, y) = \log\left(\frac{e^x + e^y}{1 + e^{-|x-y|}}\right)$$
$$= \log(e^x + e^y) - \log(1 + e^{-|x-y|})$$

can be used to reduce the implementation complexity, when computing the forward recursion, backward recursion and output metric. The function known in the literature as max-star, or max*, is defined as $$\max^*(x,y)=\log(e^x+e^y)=\max(x,y)+\log(1+e^{-|x-y|})$$

The equations for the forward and backward recursion, as well as the output metric, can be translated in the log-domain to take advantage of the above formulas.

The max*-operation can efficiently be implemented in hardware, using comparators to build the maximum and a look-up table to provide the correction term. For the cost of a slight performance degradation, the correction factor of the max* can be omitted. The approximation then only needs to evaluate the max-function.

Fixed point refinement in state-of-the-art implementation has shown [Alexandre Giulietti, Bruno Bougard, and Liesbet Van der Perre. "Turbo Codes Desirable and Designable", Kluwer Academic Publishers, 2004, which is incorporated herein by reference] that, provided that normalization is applied, a word-width of 10 bits is sufficient for all data nodes in the algorithm.

Parallel Decoding Using Approximation

Decoding a turbo code requires iterating maximum a posteriori (MAP) decoding of the constituent codes and (de) interleaving operations. Due to the high computational complexity, achieving high throughput requires a massively parallel architecture. The parallelization of the MAP can be done by computing in parallel multiple "windows" out of the coded block [as described by B. Bougard et al., in "A scalable 8.7 nJ/bit 75.6 Mb/s parallel concatenated convolutional (turbo-) CODEC", ISSCC, February 2003, which is incorporated herein by reference].

Figure 2:
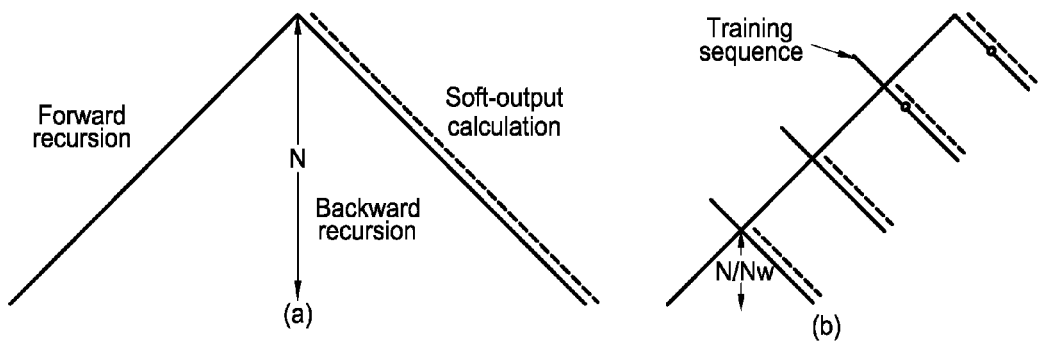
FIG. 2 compares sliding-window MAP dataflow (b) and baseline MAP dataflow (a).

The MAP decoding can be conveniently parallelized based on a derivative of the sliding-window-MAP (SW-MAP) algorithm [described by M. Bickerstaff et al., in "A 24 Mb/s radix-4 logMAP turbo decoder for 3GPP-HSDPA mobile wireless", ISSCC, February 2003, which is incorporated herein by reference]. In the original sliding window MAP algorithm, the backward recursion is split in $N_w$ smaller recursions, which are applied to $N_w$ sub-blocks of input/a priori data (windows). The corresponding dataflow is illustrated in FIG. 2(b). The state probabilities at the last element of a window is approximated based on a training sequence applied on the input data of the adjacent window. The computation of the backward-recursion training sequence of the traditional SW-MAP algorithm as illustrated in FIG. 2(a) can be avoided by computing the initial state-metric value for the backward recursion based on the last state-metric value of the adjacent window, at the previous iteration. This is referred to as next iteration initialization. Such state-metric initialization scheme can be applied to the forward recursion too. In the resulting scheme, the windows can be processed independently, which enables parallelization by a factor equal to the number of windows ($N_w$).

Figure 3:
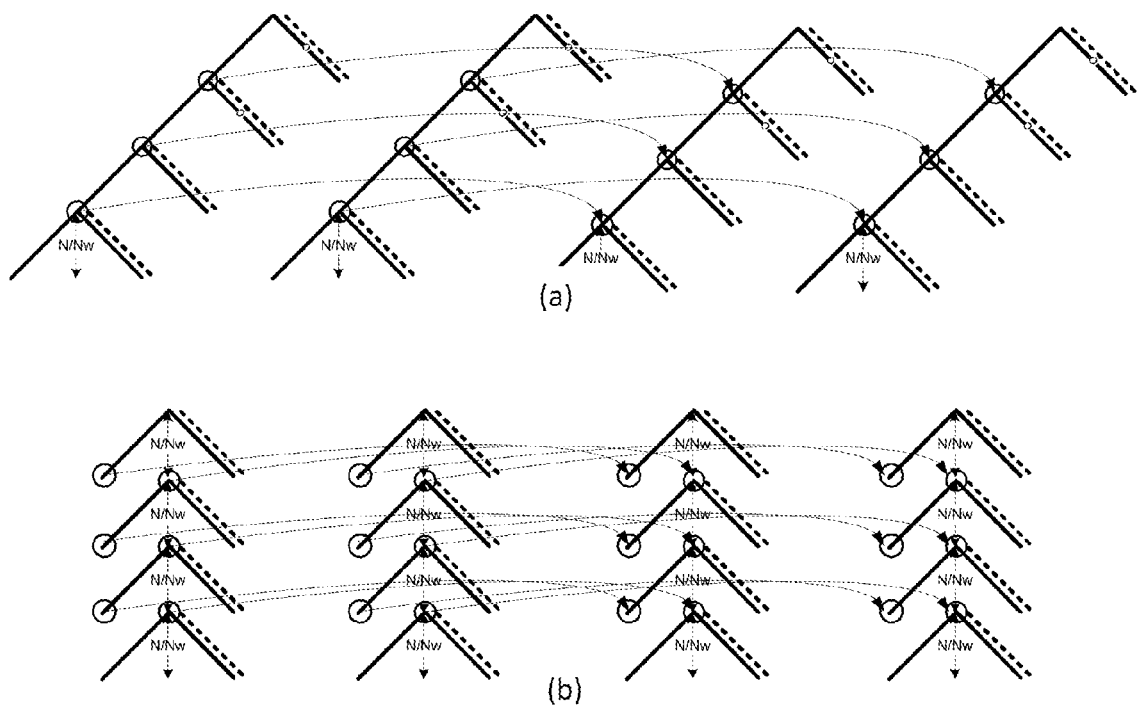
FIG. 3 illustrates the operation of a parallel MAP decoder with parallel windows.

FIG. 3 depicts the operation of a parallel MAP decoder with parallel windows. The top part (a) recalls the classical sliding windows MAP decoding flow. A forward recursion, given by Eq. (1)

$$\alpha'_k(m)=\max^*_{m'}(\alpha'_{k-1}(m')+\gamma'_k(m',m)) \qquad (1)$$

is applied to the input symbol metrics (γ). Part of the backward recursion (Eq. (2))

$$e(d_k)=\max^*_{m,m'}(\alpha'_{k-1}(m')+\gamma'^1_k(m,m')+\beta'_k(m))- \\ \max^*_{m,m'}(\alpha'_{k-1}(m')+\gamma'^0_k(m,m')\beta'_k(m))-L_{syst}- \\ L_{apriori} \qquad \text{Eq. (2)}$$

is started after a window of M inputs is treated by the forward recursion. The recursion is then initialized either using a training sequence applied on the symbol metrics from the adjacent window, or using backward state metrics (β) (Eq. (3))

$$\beta'_k(m)=\max^*_{m'}(\beta'_{k+1}(m')+\gamma'_{k+1}(m',m)) \qquad \text{Eq. (3)}$$

from a previous iteration (next iteration initialization, NII). Based on the state metrics output of the forward (α) and backward (β) recursions, next to the input symbol metrics (γ), the MAP outputs (extrinsic information, e) can be computed. Using NII is preferred as it leads to more regular data flow. That way, as shown in FIG. 3(b), the MAP can easily be parallelized by computing several windows in parallel.

Besides the MAP, interleaving operations must also be parallelized. As interleaving means permutating the data out of a memory, parallelizing it requires to use multiple memory banks and to handle potential collision in read and write operations. For this, collision free interleaving patterns or collision-resolution architectures were proposed in [Giulietti, A.; van der Perre, L.; Strum, A., "Parallel turbo coding interleavers: avoiding collisions in accesses to storage elements," Electronics Letters, vol. 38, no. 5, pp. 232-234, 28 Feb. 2002, which is incorporated herein by reference]. Later, Tarable proved that any interleaving law can be mapped onto any parallel multi-banked architecture [Tarable, A.; Benedetto, S.; Montorsi, G., "Mapping interleaving laws to parallel turbo and LDPC decoder architectures," IEEE Transactions on Information Theory, vol. 50, no. 9, pp. 2002-2009, September 2004, which is incorporated herein by reference]. He also proposed an annealing algorithm that is proven to always converge to a valid mapping function.

In embodiments of the present invention, we are capitalizing on the multi-window MAP parallelization combined with Tarable's interleaving law mapping. A single-instruction multiple-data (SIMD) approach is used. The computation of γs, αs and βs over the branches or states are serialized but multiple windows are computed in parallel to maximize data-level parallelism.

LDPC Decoding Algorithm Exploration

Introduction

Figure 4:
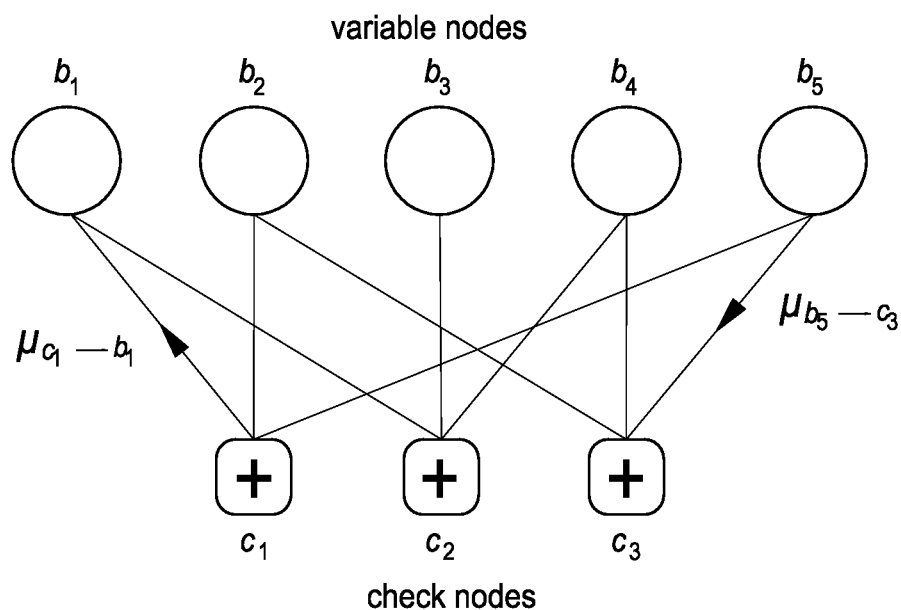
FIG. 4 illustrates the H matrix (top), bipartite graph (middle) and parity check equations defining an LDPC code.

Low-density parity-check (LDPC) code is an error correcting code, a method of transmitting a message over a noisy transmission channel. LDPC codes in the class of linear block codes, form the counterpart to turbo codes in the class of convolutional codes. The parity-check matrix representing LDPC codes is a sparse matrix, meaning that there are only a few elements not equal to zero, as illustrated in FIG. 4(a). This property has clear advantages which will be addressed later. LDPC codes with an arbitrarily long block length N are performing very close to the theoretical transmission rate limit.

The parity-check matrix defining an LDPC code can be represented as a bipartite graph, a graph whose vertices can be divided into two disjoint sets such that every edge connects a vertex in one set to one in the other set; also called tanner graph or factor graph, see FIG. 4(b). This representation is more convenient for understanding the basic algorithm and data flow, it will therefore be used in later explanations. The graph contains two types of nodes: check nodes c and bit nodes b. Bit nodes are also referred to as variable nodes. Check nodes are corresponding to the rows M of H and therefore each parity-check equation forms one check node. Bit nodes are corresponding to the columns N of H and therewith each bit of the received codeword y is assigned to one column. In FIG. 4(a), the first row of H, for example, forms the check equation $c_1$ and therewith the check node c1, as illustrated in FIG. 4(c). Check nodes c and bit nodes b are connected by edges, where a check node and a bit node are connected over an edge if the corresponding entry in the parity-check matrix H is equal to 1. Due to the low density or sparseness and to the randomness of the parity-check matrix, there are very limited, but quasi-random connections between nodes. The degrees of check and bit nodes are defined by the number of edges which are connecting them with neighboring bit or check nodes and are denoted $d_c$ and $d_v$, for check and bit node degree, respectively. An LDPC code is called regular, when the degrees $d_c$ and $d_v$ are constant for all check nodes and all bit nodes. In case of irregular LDPC codes, the degrees are varying among the nodes. The parity-check matrix depicted in FIG. 4(a) represents an irregular code, what can be seen on the imbalanced number of connections between check nodes and bit nodes.

Due to the constant check node and bit node degrees $d_c$ and $d_v$, regular codes are typically easier to encode and enable more structured decoder architectures. Irregular codes however, are outperforming regular ones and are approaching very close to the Shannon bound. These improvements in decoding performance are due to the faster convergence of nodes with higher degrees, which then assist others with lower degrees, by providing them with more reliable information.

Decoding of LDPC codes is done iteratively. Messages are passed between nodes, which implements the basic concept of iterative decoding. In the first iteration, no a priori information is available to refine the probabilities of the bit nodes. After each iteration, a more accurate estimate of the received vector y can be provided. Decoding is stopped, when a valid codeword is found.

As in the case of turbo codes, LDPC decoding can be expressed and approximated in the logarithmic domain. For the check node computation, the bit node computation, as well as for the output computation which involve a large amount of multiplications, this transformation has clear advantages. Furthermore, for every bit node message and every check node message, two corresponding probabilities need to be stored, which becomes unpractical for large block length. Consequently, the same approach as applied to the Viterbi and BCJR algorithms, a representation in the logarithmic domain has several advantages and will therefore be highlighted for LDPC codes in the next paragraph.

Decoding Algorithm Approximation

The multiplicative nature of the LDPC decoding algorithm in the probabilistic domain and the need for the non-linear function in the logarithmic domain makes it impractical for hardware implementation. Feasible, reduced-complexity approximations must be found, to enable efficient, low-power and high-throughput implementations. The throughput and decoding complexity of LDPC codes depend on five major parameters:

1. The length N of the codeword (block length),
2. The ratio of number of information bits to block length (code rate),
3. The complexity of the computations at each check node,
4. The complexity of the interconnect network between check and bit nodes, and
5. The number of needed iterations to produce a valid codeword.

In order to tackle these five bottlenecks, optimizations at different levels need to be performed. In order to achieve sufficient bit error ratio (BER, the ratio between the number of incorrect bits transmitted to the total number of bits transmitted) performance, the block length needs to be held at a predetermined length. The code rate needs to be adapted to the environment in order to guarantee reliable communication and can therefore not be increased as desired.

For the three remaining bottlenecks, namely the check node and interconnect network complexity, as well as the number of iterations, solutions or partial solutions have been proposed in the literature and will be presented in the following order. First the min-sum (min+) algorithm [as described by Marc P. C. Fossorier, Miodrag Mihaljevic, and Hideki Imai, in "Reduced complexity iterative decoding of low-density parity check codes based on belief propagation", T-COMM, 47(5):673-680, 1999; and by Farhad Zarkeshvari and Amir Banihashemi, in "On implementation of minsum algorithm for decoding low-density parity-check (LDPC) codes", Technical report, Dept. of Systems and Computer Engineering, Carleton University, 1125 Colonel By Drive, Ottawa, Canada K1S5B6, 2002, both of which are incorporated herein by reference] can be mentioned, approximating the sum-product algorithm, as presented in [Robert G. Gallager, "Low-density parity-check codes", IRE Transactions on Information Theory, pages 21-28, 1962, which is incorporated herein by reference]. This optimization reduces the check node complexity. On the other hand, the exploitation of the block-based structure of a sub-class of LDPC codes can be exploited in the layered belief-propagation decoding scheme [D. Hocevar, "A Reduced Complexity Decoder Architecture via Layered Decoding of LDPC Codes", IEEE Workshop on Signal Processing Systems, pages 107-112, 2004, which is incorporated herein by reference], which reduces the interconnect overhead, as well as the number of iterations needed. Finally, the turbo decoder-based message passing algorithm [Mohammad M. Mansour and Naresh R. Shanbhag, "Turbo decoder architectures for low-density parity-check codes", Technical report, iCIMS Research Center, Co-ordinated Sciencs Laboratory, University of Illinois at Urbana-Champaign, Ill. 61801, 2002, which is incorporated herein by reference], which enables the exploitation of potential hardware reuse in case the decoder architecture may be used for turbo codes and offers an efficient way to calculate check node messages, in case of decoding LDPC codes.

Parallel LDPC Decoding Using Approximation

Figure 5:
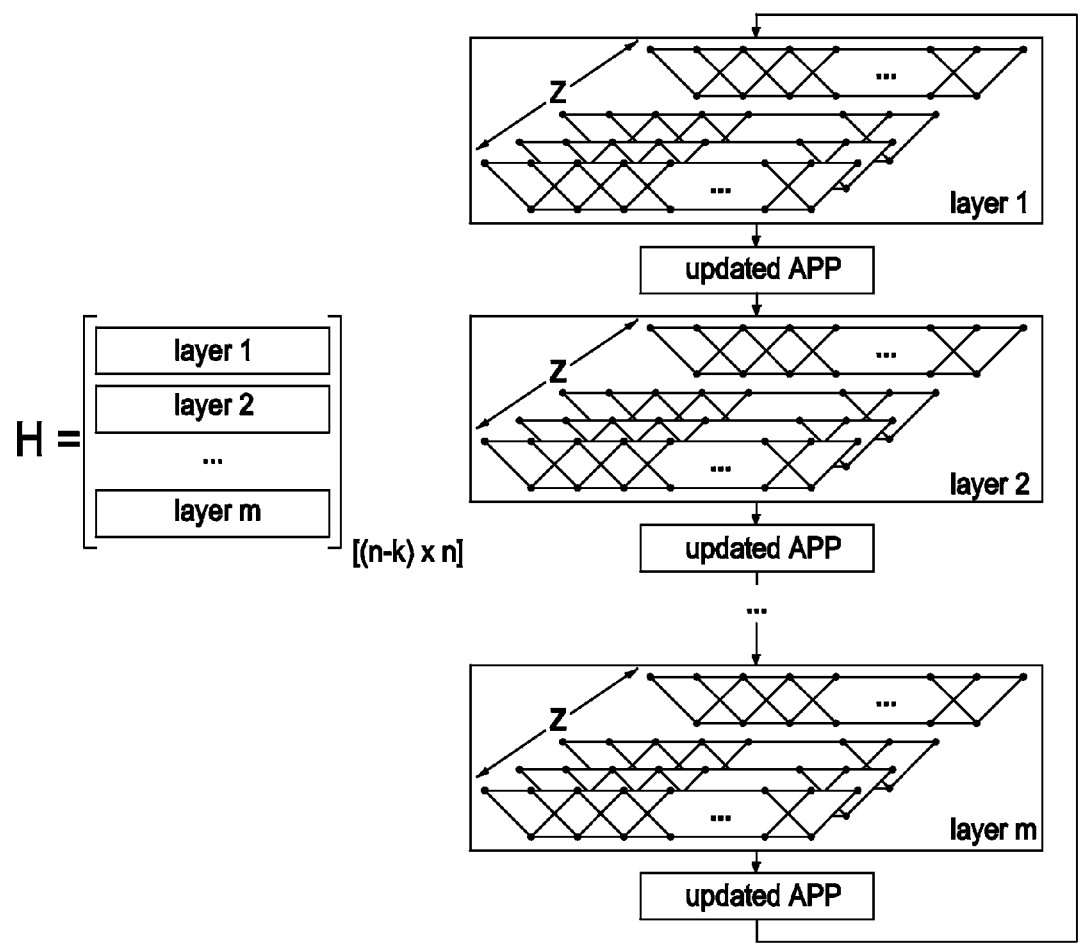
FIG. 5 illustrates LDPC Layered Decoding.

Considering a LDPC decoding, previous work has shown how layered decoding, which reduces the number of iterations needed to converge, can be efficiently implemented on a SIMD architecture. In layered decoding [D. Hocevar, "A Reduced Complexity Decoder Architecture via Layered Decoding of LDPC Codes", IEEE Workshop on Signal Processing Systems, pages 107-112, 2004, which is incorporated herein by reference] the parity check matrix H of size (n−k)× n, where n equals the total codeword size and k equals the number of data bits. needs to be decomposable into m arbitrary chosen sub-matrices with size z×n, with z equal to (n−k)/m, also called super-codes (FIG. 5). For every super-code, the position of 1s is restricted such that, per column in a super-code, only zero or one non-zero element is allowed. For the standards in scope this property is automatically met, through the fact that the sub-matrices within the super-codes are either zero matrices or cyclic permuted identity matrices. This is not the case with the DVB-S2 code. However, in this case, the parity check equations can be reordered (as well as the received parity metrics respectively) in order to define a layered matrix satisfying the aforementioned property.

Within a layer, the check node and corresponding bit node updates can then be done in parallel since there is only one edge from every bit node towards a check node in a layer. Intrinsically this enables z parallel processing threads each performing check node updates and message node updates corresponding to a row within the layer of the parity check matrix. As the same operation has to be applied at the same time in z threads, SIMD implementation is again very efficient.

Performance Results

From the previously mentioned decoding algorithm approximation techniques, both the layered-belief-propagation-based (using the min-sum approximation) and the turbo-based decoding (using the max* approximation) are taken into account for performance comparison. The performance comparison is based on BER performance and on required iterations using a fixed point refined code.

Due to the lack of floating-point arithmetic support in hardware of embodiments of the present invention, which would lead to a significant area overhead, a more feasible fixed-point number representation is chosen.

A fixed-point scheme, where a virtual decimal point is introduced, enables an efficient way to work with fractional values. This representation is preferable for hardware implementations, in terms of area overhead and energy efficiency.

Denote as $Z_{I.Q}$ the fixed-point counterpart of a floating-point value Z, where I and Q digits are used for the integer and fractional part of the value, respectively. The range which can be represented by this quantized value is given by $$[-2^{(I-1)}, +2^{(I-1)}-2^{-Q}] \quad \text{Eq. (4)}$$

where the Most Significant Bit (MSB) is used to store the sign of the message. The resolution of the fixed-point number is then given by $$\epsilon = 2^{-Q}$$

The overall word length, needed to represent a number $Z_{I.Q}$, is given by I+Q.

The Log-Likelihood Ratio (LLR) messages to be represented in fixedpoint arithmetic, can take values in the range of $[-\infty, \infty]$. In their fixedpoint depiction, this dynamic range is saturated to the bounds shown in Eq. (4). Overflows occurring during fixed-point arithmetic operations are avoided by applying a saturation scheme. The quantization of the messages involved in the decoding process, has been split up in three parts. First, the input messages passed to the decoder are assumed to be represented by $Z_{I.Q}$, e.g. $Z_{4.2}$. This results in an overall word length of 6 bits, where Q bits, e.g. 2 bits, are spent for the resolution of the message and I bits, e.g. 4 bits for the integer part. Two bits for the fractional part of a message leads to a resolution of $Q=2^{-2}=0.25$. In practical systems, a quantization width of 3 to 6 bits for the soft-values received from the channel, has shown to be accurate enough to deliver near-optimum performance.

Secondly, the data path and therewith the internal message representation has been varied for different experiments, where the word length ranges from 11 bits down to 7 bits, with a resolution held at 2 bits each.

Finally, a normalization factor γ has been introduced for all check to bit node messages ($\mu_{cj} \to b_i$). See Eq. (5) for the min-sum approximation and Eq. (6) for the max*-based approximation.

$$L(\mu_{c_j \to b_i}) \approx \gamma \cdot \min_{i' \in R[j] \setminus i} |\beta_{ji'}| \cdot \prod_{i' \in' R[j] \setminus i} \alpha_{ji'} \quad \text{Eq. (5)}$$

with $0 < \gamma \leq 1$.

$$\Lambda_i = \gamma \cdot q(\Delta \alpha_{i-1}, \Delta \beta_i) \quad \text{Eq. (6)}$$

Figure 6:
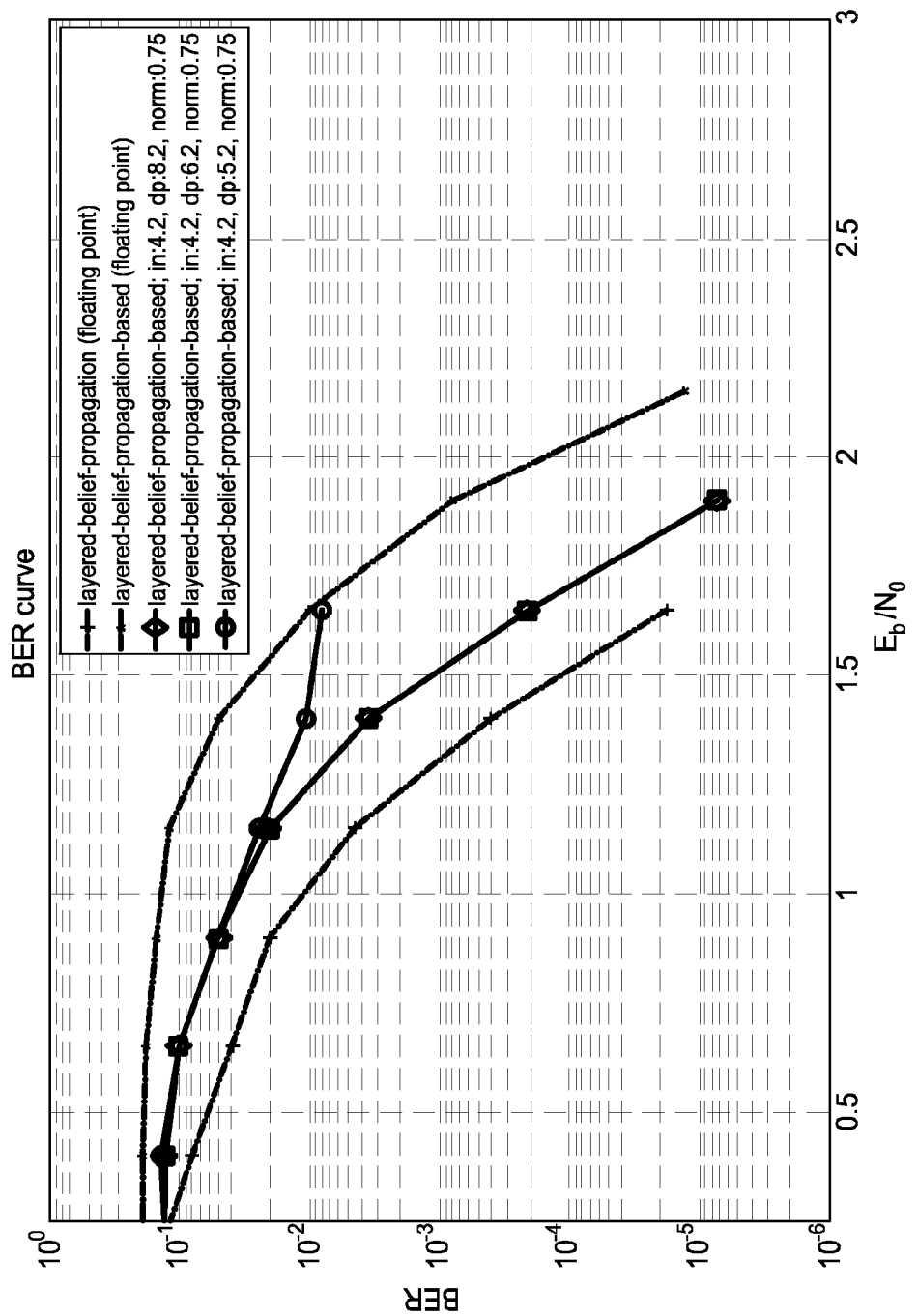
FIG. 6 is a graph illustrating BER performance for a quantized layered-belief-propagation-based decoding scheme.
Figure 7:
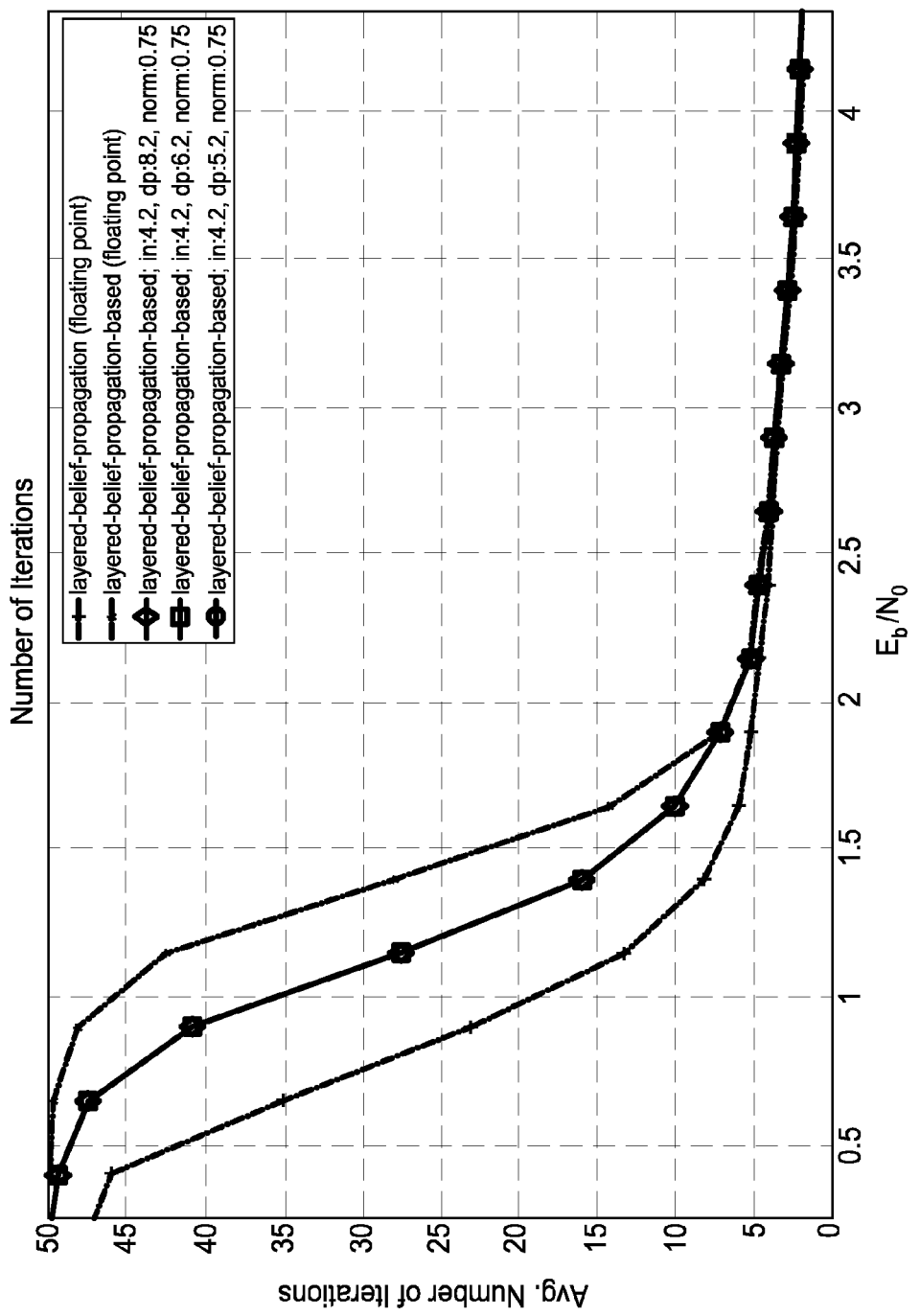
FIG. 7 illustrates convergence speed for a quantized layered-belief-propagation-based decoding scheme.

Comparison of BER performance for the quantized layered-belief-propagation-based decoding scheme in function of the received energy per bit normalized with the noise power ($E_b/N_0$). can be found on FIG. 6. The algorithms are implementing the min-sum approximation (denoted as layer-belief-propagation-based in contrary to the optimal layer-belief-propagation method) and are quantized with $Z_{8.2}$, $Z_{6.2}$ and $Z_{5.2}$ for the data path. The input values, obtained from the channel, are quantized with $Z_{4.2}$. It is to be noted that a normalization factor has been introduced for all check to bit node messages. The convergence speed for these modes is depicted on FIG. 7.

What needs to be noticed here is that when comparing the quantized implementation of the min-sum approximation with the one in floating-point, the quantized version delivers the same BER with an required receive energy which can be reduced by a half dB. Such a positive influence of quantization is very rarely observed. Similar effects have been observed in [Farhad Zarkeshvari and Amir Banihashemi, "On implementation of minsum algorithm for decoding low-density parity-check (LDPC) codes", Technical report, Dept. of Systems and Computer Engineering, Carleton University, 1125 Colonel By Drive, Ottawa, Canada K1S5B6, 2002, which is incorporated herein by reference], where quantization in general also degraded the performance, but clipping could provide improvements compared to the ideal implementation.

Figure 8:
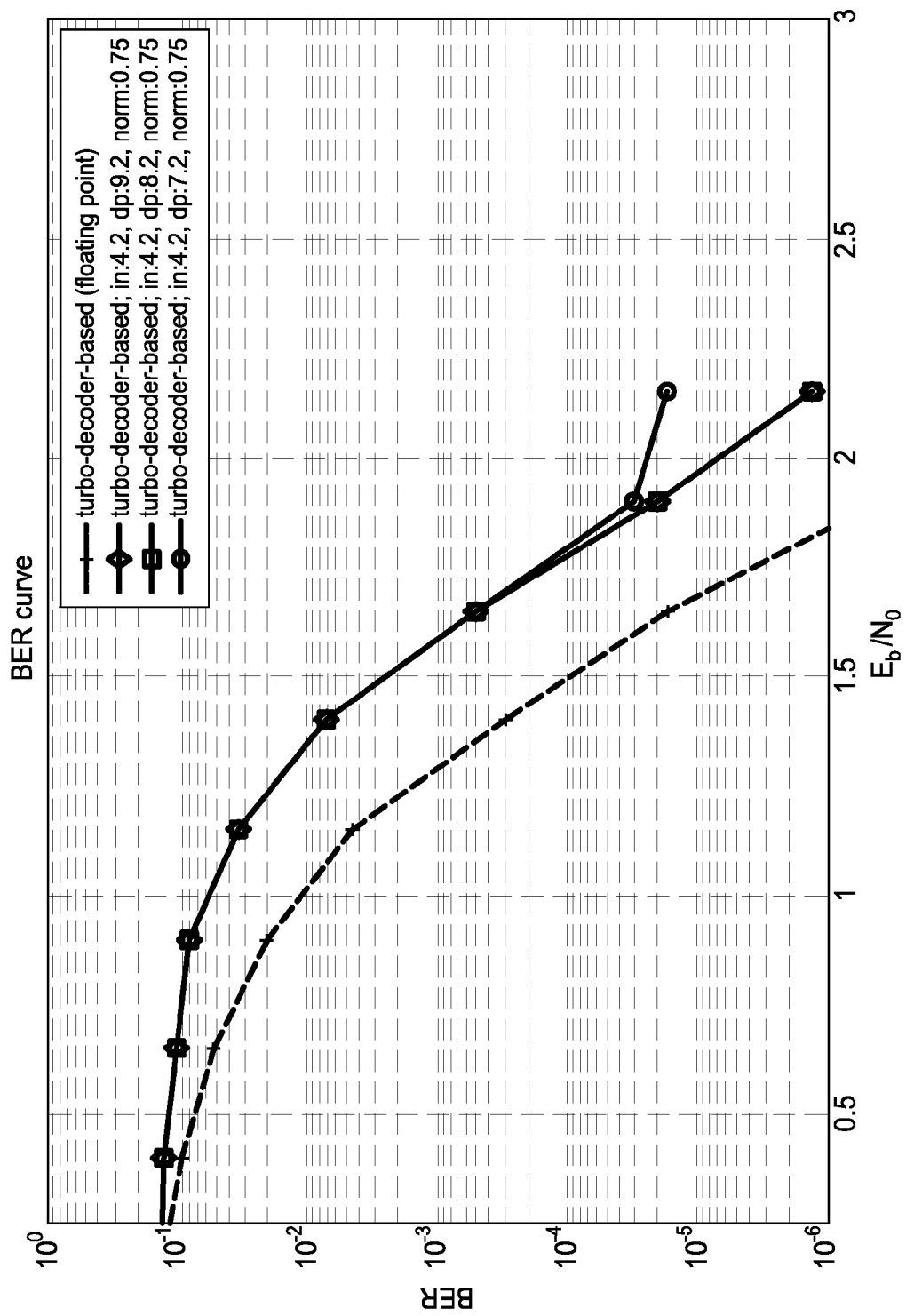
FIG. 8 is a graph illustrating BER performance for a quantized layered-turbo-decoder-based scheme.
Figure 9:
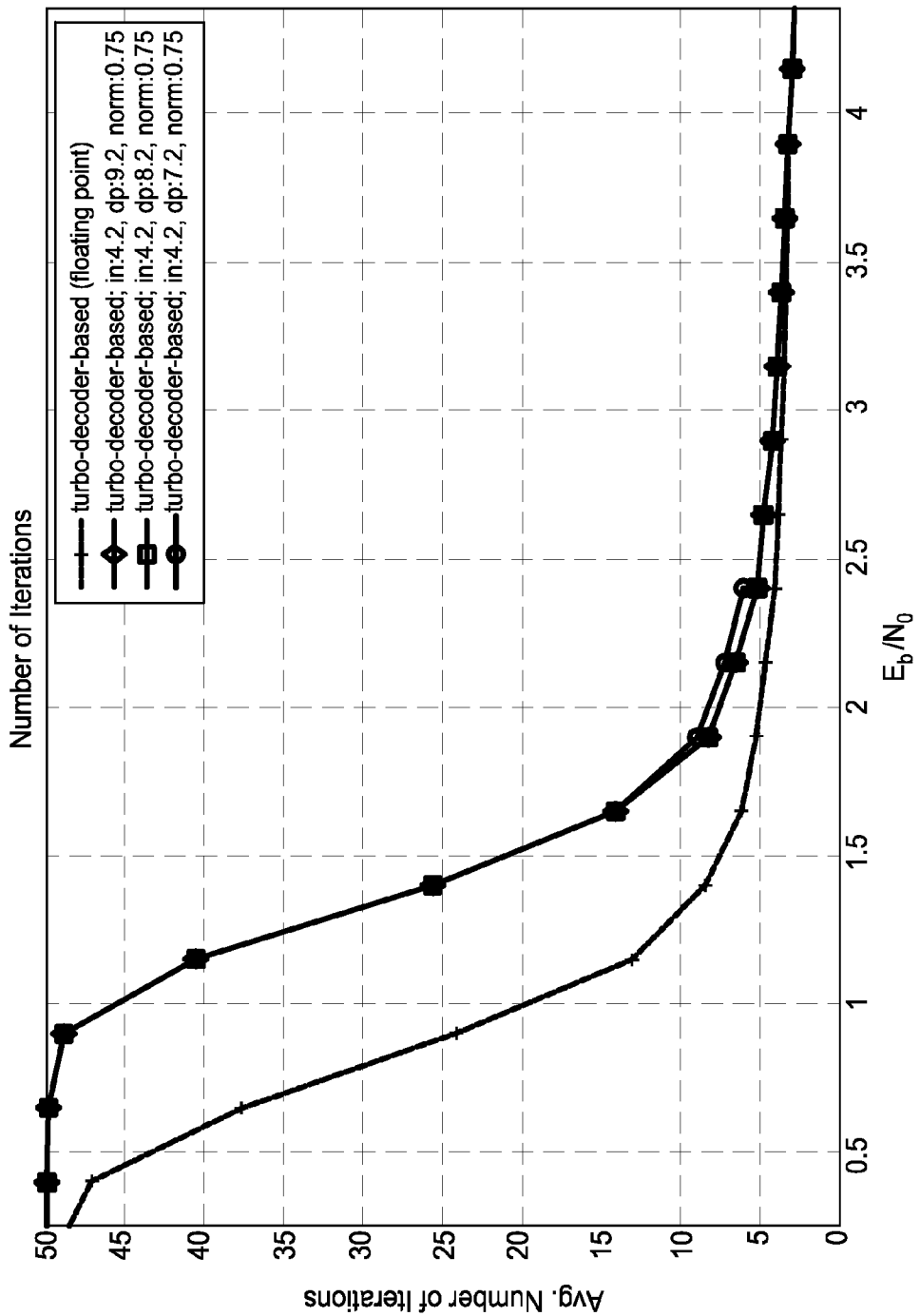
FIG. 9 illustrates convergence speed for a quantized layered-turbo-decoder-based scheme.

Comparison of BER performance for the quantized layered-turbo-decoder-based decoding scheme is depicted on FIG. 8. The algorithm is implementing the max*-based approximation and is quantized with $Z_{9,2}$, $Z_{8,2}$ and $Z_{7,2}$ for the data path. The input values, obtained from the channel, are quantized with $Z_{4,2}$. The convergence speed for the quantized layered-turbo-decoder-based decoding is depicted on FIG. 9.

Even though the max*-based approach delivered near-optimum decoding performance with largely reduced computation complexity when implemented in floating-point, its quantized version involves a performance loss of around half of a dB. The min-sum approximation on the other hand, shows inverted behavior, the quantized version delivers better simulation results than the floating-point implementation.

Comparing the convergence speed, the quantized version of the min-sum algorithm also beats the max*-based approach, even if this could not be foreseen when looking at the floating-point implementations. There, the max* operates very close to the optimum, due to the very accurate approximation of the non-linear function. When comparing FIG. 7 and FIG. 9 at Eb/No point of 1.5 dB, the min-sum approximation needs around 10 iterations less to converge, compared to the max*-based one (both in the fractional format). This can make a significant difference in terms of throughput.

Unified Architecture Concept

While the LDPC decoder architecture is heavily dependent on the parity-check matrix structure, the Turbo decoder architecture is dependent on the trellis structure representing the encoder. This makes it very challenging to develop a decoder which is flexible enough to handle LDPC codes and turbo codes for all desired communication standards. More generally speaking, it is an object of embodiments of the present invention to provide a decoder which is flexible enough to handle at least two decoding methods which are different in underlying coding principles. Generally speaking, a tradeoff must be found between the compatibility to different code classes (decoding methods which are different in underlying coding principles), the decoder architecture efficiency and the performance in terms of area and energy. This trade-off can be achieved according to embodiments of the present invention by developing an instruction set processor with a unified instruction set, suitable for the at least two decoding schemes.

Depending on the similarities of the core computations needed for the different decoding methods, can this offer a feasible solution.

The discussion hereinafter will focus on the LDPC-specific requirements of a unified decoder architecture according to embodiments of the present invention which will be developed by applying an ASIP-like design methodology. The unified instruction set according to embodiments of the present invention is generally designed for decoding different algorithms for LDPC codes, but can also be applied for decoding turbo codes.

Before considering the architectural part of the decoder implementation, where the layered scheme for architecture-aware codes is applied, care must be taken of the fixed-point number representation used for incoming messages and internal computations and storage.

ASIP Design Methodology

Developing a general purpose processor would offer the maximum level of flexibility, but due to the high-throughput requirements this approach is not applicable. An ASIC design, which would allow very high-throughput implementations, lacks the flexibility desired for handling at least two decoding methods which are different in underlying coding principles. According to embodiments of the present invention, an ASIP is used, which forms a feasible trade-off in terms of throughput, flexibility and energy efficiency. Hence the architecture development will follow an ASIP-like methodology to derive the unified decoder architecture according to embodiments of the present invention.

The first task to perform when developing an ASIP architecture, is an extensive algorithm exploration and analysis to identify the main computation kernels. The algorithm exploration will be concluded by performing a fixed-point refinement of the selected decoding algorithms.

The knowledge of the decoding algorithms enables one to define an instruction set suitable for efficient computation of the main kernels. Defining the instruction set of a processor architecture, trades the flexibility and achievable throughput against silicon area and energy efficiency. Hence the selection, which basic operations should be dedicated to an instruction, must carefully be carried out.

With the optimized instruction set at hand, the achievable throughput can be evaluated. By choosing the right amount of parallelism, for instance by applying a single-instruction multiple-data (SIMD)-based computation scheme, the throughput can be adapted to the system requirements. Limited, of course, by the inherent parallelism given by the targeted algorithms.

The level of parallelism implies the definition of the data path width, which has a direct impact on the memory organization. According to embodiments of the present invention, the memory hierarchy should be properly adjusted, to avoid bottlenecks due to memory latencies.

As a final process, the overall decoding latency of the architecture can be controlled by introducing a pipelining scheme.

Figure 10:
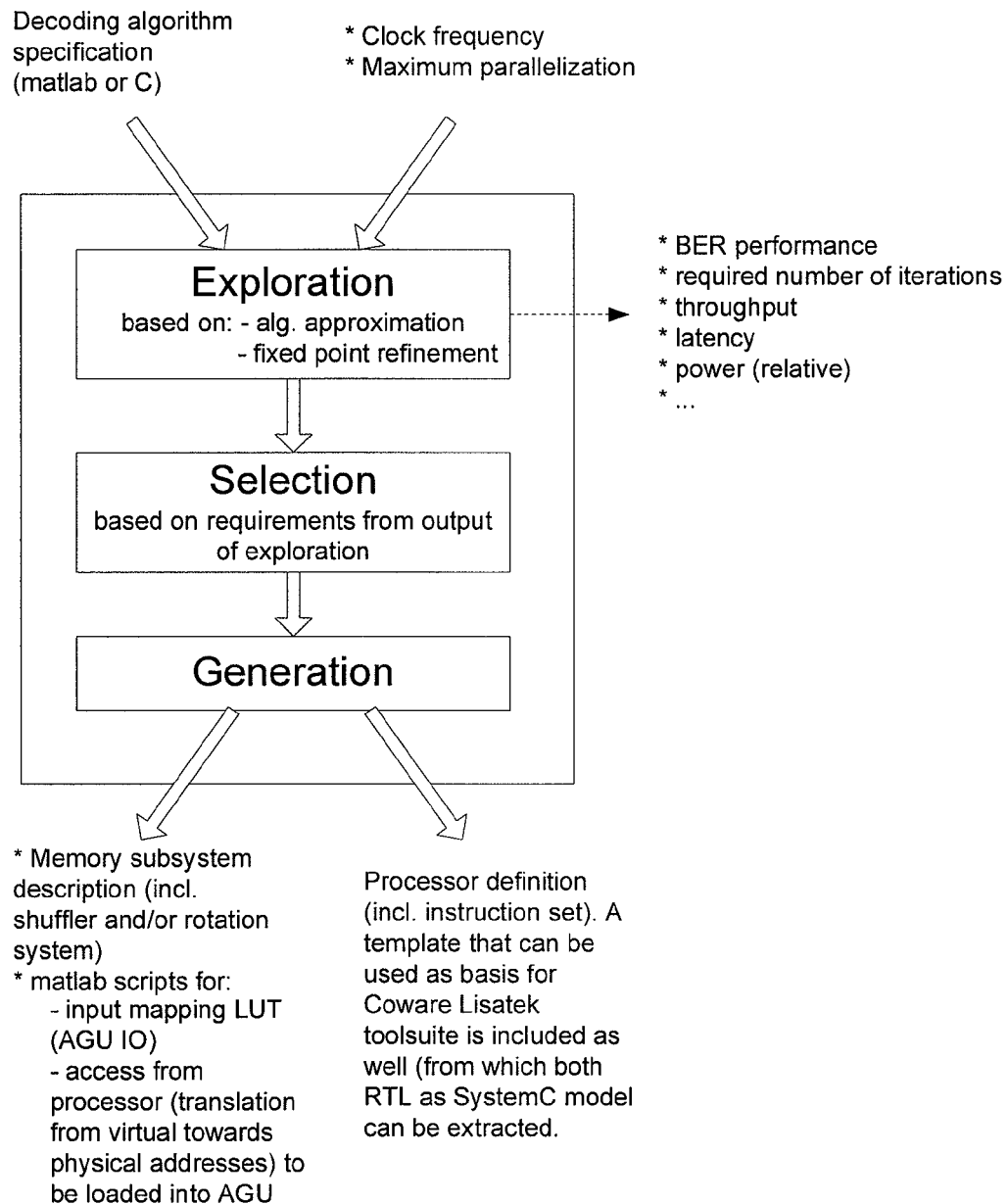
FIG. 10 is a block-schematic overview of the semi-automated toolflow for the definition of the decoder architecture based on decoding algorithmic input.

The performance number as depicted on FIG. 6, FIG. 7, FIG. 8 and FIG. 9, illustrates that there are trade-offs that can be made in decoding both turbo codes as LDPC. In order to unify multiple decoding methods, such as for example, but not limited thereto, LDPC and turbo decoding, resulting in a novel architecture, a semi-automated toolflow was established according to embodiments of the present invention. The result of the toolflow is depicted on FIG. 10. As input of the process an algorithmic description, e.g. in matlab or C code, of the decoding algorithm is required, and this for the plurality of decoding algorithms to be combined in the architecture, next to the specification of clock frequency and maximum parallelization.

During the exploration phase the different algorithms specified, with their possible approximations and fixed point refinements, are evaluated for a number of outputs. Some of these outputs are: BER performance, required number of iterations, throughput, latency and power. It is to be noted that the power number at this stage can only be used for a relative comparison.

Based on the output generated in the exploration phase, in the selection phase a selection of the different decoding flavors for which support needs to be provided, can be selected.

During the generation phase, both memory subsystem and processor definition are derived. The memory subsystem includes the memory bank structure combined with interconnect and permutation logic, in the form of combined shuffler and rotation engines. Additionally matlab scripts are generated for both initializations of memory banks as translations for virtual address mappings.

The processor definition includes the instruction set list and a template that can be used as input in simulation software, e.g. Coware Lisatek toolsuite. This toolsuite can generate RTL and high-level simulation model that can be used SystemC model.

Conceptual Overview

Figure 11:
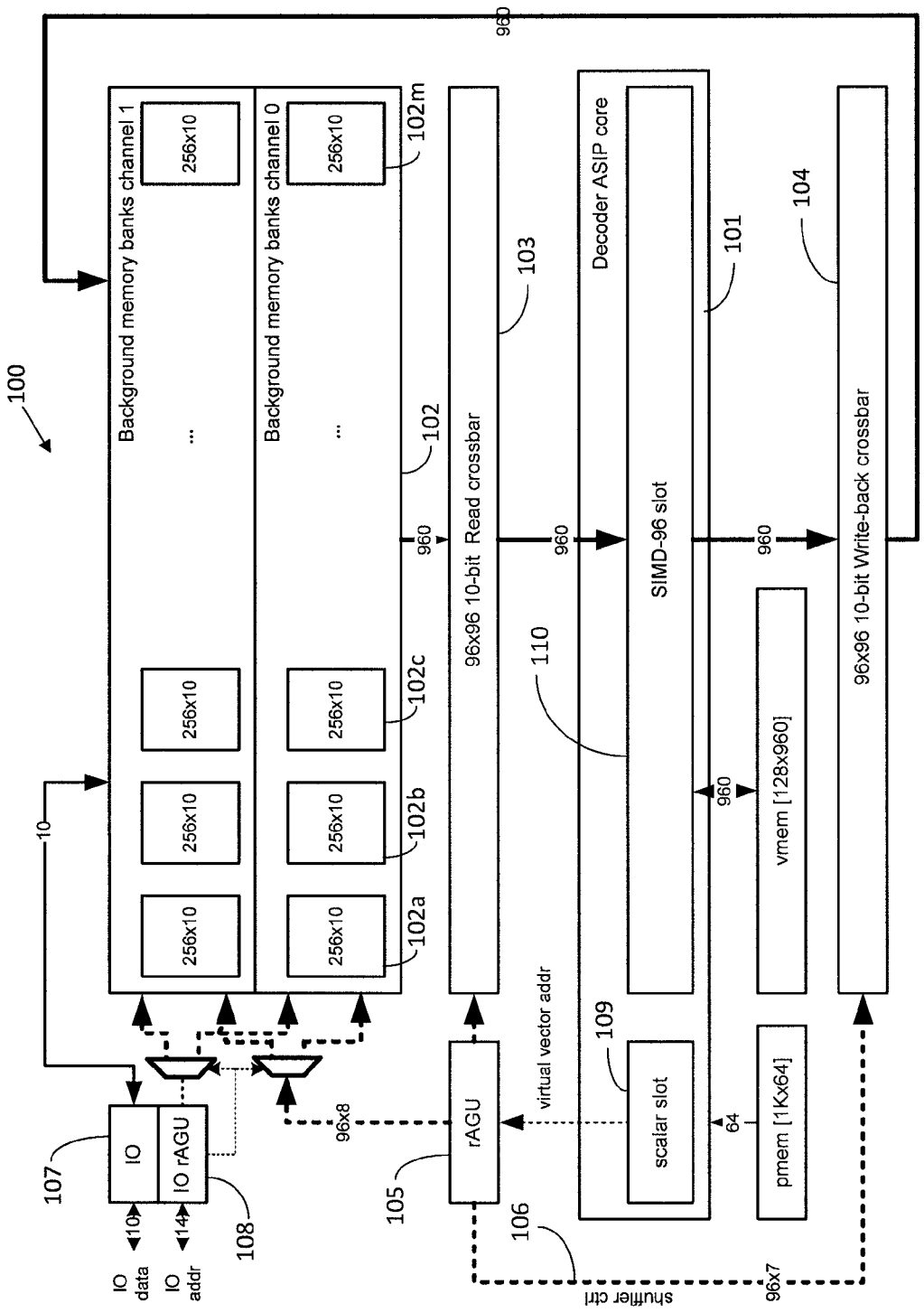
FIG. 11 is a block-schematic overview of a decoder architecture of a processor with a 96-slot SIMD decoding engine according to embodiments of the present invention.

A general overview of a decoder architecture 100 according to embodiments of the present invention is shown in FIG. 11. This is a unified application specific instruction set processor architecture template that efficiently fits at least two data decoding methods, e.g. both turbo and LDPC decoding. In the following, the detailed description is oriented towards a combination of at least turbo decoding methods and LDPC decoding; however, this is only for ease of explanation, and the present invention is not limited thereto.

The proposed architecture 100 combines a multi-slot SIMD datapath 101 (implementing dedicated instructions to support both LDPC and turbo decoding) with a distributed background memory structure 102. The background memory structure 102 is such that there are as many single-ported memory banks 102a, 102b, 102c, . . . 102m as SIMD slots. These are connected to the core 101 with a read cross-bar 103 and a write-back cross-bar 104.

An idea of embodiments of the present invention is to hide the shuffling needed by the decoding methods, e.g. the scrambling needed by the LDPC and the interleaving required by the turbo-decoding, using reconfigurable address generation units (rAGU) 105. The core SIMD program, written in a low-level programming language such as assembly code, assumes a virtual address space where collisions never happen. The collision free operation allows a continuous mode decoding operation, without delay in data accesses. This virtual address space is mapped to physical background memory addresses in the background memory structure 102, whereby the read and write-back crossbar control 106 uses the rAGUs 105. The rAGUs 105 may be configured with look-up tables (LUT). In case the rAGU needs to drive a rotation engine, the complete LUT could be replaced by a single value e.g. for the first slot an address generators for the other slots, by incrementing the first value.

The detailed decoder architecture according to embodiments of the present invention is depicted in FIG. 11.

A two channel implementation of the background memory structure 102 as illustrated in FIG. 11 allows streaming mode or dual channel processing, but is not required in all embodiments of the present invention. Due to the dual channel implementation of the background memory structure 102, data in one memory channel can be processed while the next set of data is read into the other memory channel. FIG. 11 depicts an architecture with a 96-bit wide SIMD processor 101. The width of the processing engine 101 depends on the level of parallelism present in the decoding algorithms that need to be supported. Alternative decoder architecture templates according to embodiments of the present invention exploit higher parallelism.

Systematic stream, coded streams, extrinsic and a priori information in case of turbo decoding; bit-node information in case of LDPC are stored into the background memory structure 102. The data is made available as a virtual linear memory map to the decoder core 101, hiding the bank addresses and data permutations. In embodiments of the present invention, an IO unit 107, combined with an IO rAGU 108 controls the input/output mapping in one memory bank channel while the core rAGU 105 performs virtual to physical address translation to the other memory bank channel (ping-pong buffers).

Simulations have shown that a background memory word size of 10-bit leads to performance close to floating-point reference implementation for both turbo as LDPC decoding (independent of the max* or min-sum approximation used).

According to embodiments of the present invention, this architecture 100 can be used in different modes.

In turbo mode, the rAGU 105, e.g. the rAGU LUT, implements the data mapping resulting from the collision free mapping of the turbo-code interleaver law As an example, Tarable's annealing algorithm can be implemented in a tool that generates the rAGU LUT configuration taking as input the interleaver table and the number of parallel slots in the ASIP core used to perform the decoding operations.

Hence, received systematic, coded and extrinsic information inputs for each MAP window can be read or written in or from each slot in a collision-free way, either in direct logical order or in interleaved/deinterleaved logical order.

In most of the LDPC modes used within current wireless standards, such as e.g. the 802.16(e) and 802.11n standard, the permutations are rotations. Due to the flexibility provided in the shuffler engine 105, 106 according to embodiments of the present invention, this property is not even required.

Figure 12:
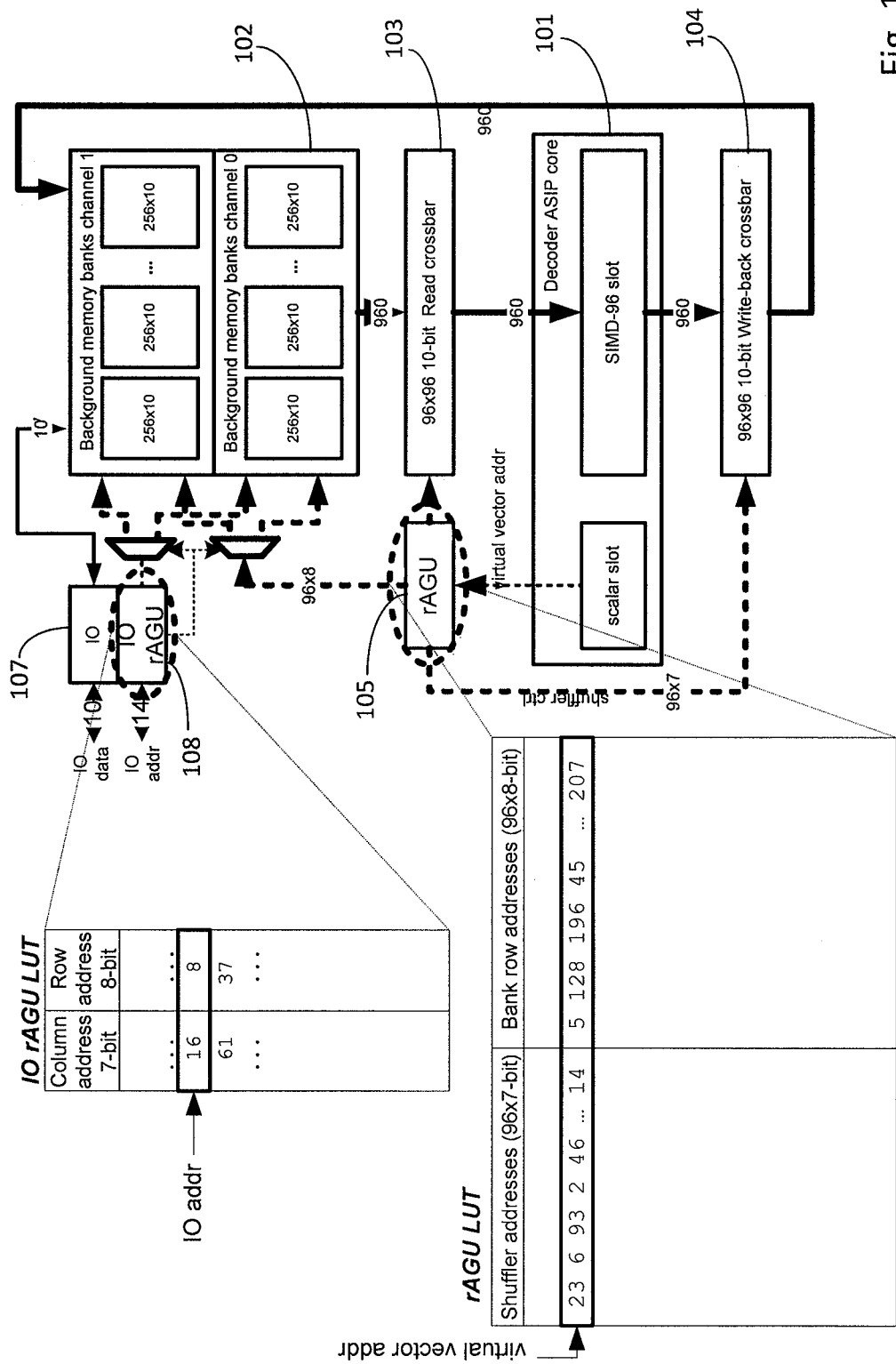
FIG. 12 depicts an example of the usage of a transparent background memory through rAGUs according to embodiments of the present invention.

An example of the usage of the transparent background memory structure 102 through the rAGUs 105, 108 is depicted on FIG. 12. To operate in streaming mode the input/output can be performed in one memory bank channel 102, during decoding processing on the other. The input/output may be done in serial fashion, where the IO rAGU 108, e.g. the JO rAGU LUT table, specifies the location of both soft information and hard decision output bits.

For decoding processing, a virtual address is provided to the rAGU 105, e.g. the rAGU LUT, which determines addresses for respectively shuffler control 106 and row addresses for memory bank structure 102. Both LUT tables are correlated.

In case of turbo mode operation, the IO rAGU 108, e.g. IO LUT, is deducted from Tarable's annealing algorithm, while the rAGU 105, e.g. LUT, for decoding operation also requires the interleaving pattern. The decoder core rAGU 105, e.g. LUT, stores address translation both for the direct read/direct write and interleaved read/deinterleaved write phases.

For LDPC mode operation, where the parity check matrix consists out of cyclic permuted identity matrices, the structure of the rAGU, e.g. LUT tables, is more uniform. As for the JO rAGU 108, e.g. IO LUT, the memory is filled in linear order, first for row 0 and increasing column, before starting row 1, . . . . The rAGU 105, e.g. LUT table, for decoding operation will contain identical row bank addresses for all slots and shuffler addresses will be cyclic shifts depending on the rotation value in the parity check matrix.

In case support for DVB-S2 LDPC modes needs to be foreseen, the decoder template can be extended to a single bigger processor, e.g. 360 SIMD slot processor, or multiple SIMD processors put in parallel. An example of a Px96 SIMD slot processor instance is depicted on FIG. 13. P is the number of parallel processors used. In order to have a maximum parallelization of 360, P could be equal to 4. The decoder architecture then comprises P processors each having an N-slot SIMD processor. Besides the SIMD pipeline 111, the processor instances also contain a control unit 112 with allocated program memory 113 and register file 109, vector register file 115 and vector cache. The data read from the memory bank 102 is first permuted by the shuffler 103, 104, after which a rotation can be performed over the multiple banks 102 by means of a rotation engine 120. Contrary to the decoding architecture presented in FIG. 11, the vector part of the processor is also equipped with a LIFO memory 116. The vector LIFO 116 allows easy storage and access of temporary data elements.

Figure 13:
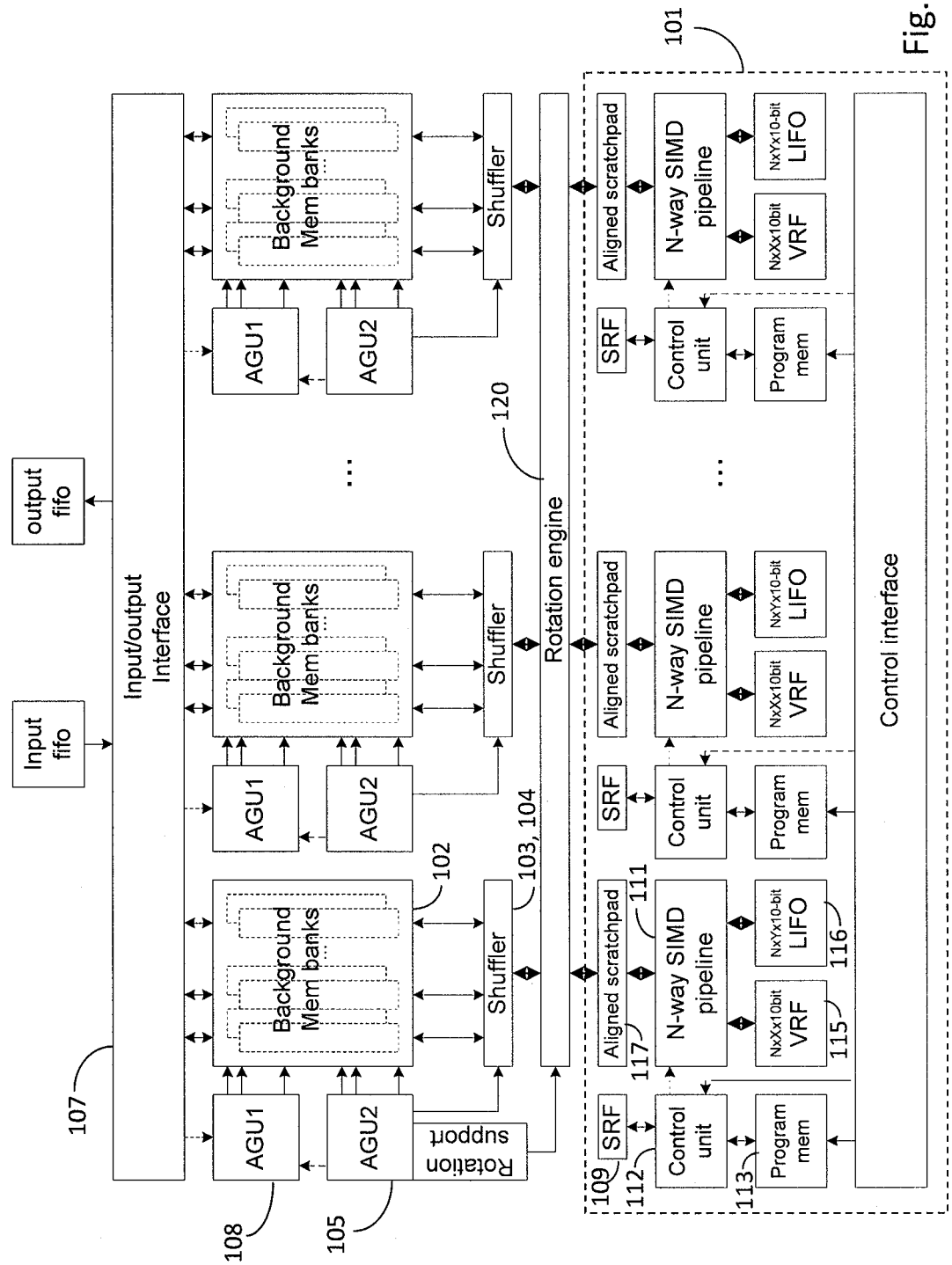
FIG. 13 illustrates an amended decoder architecture adapted for DVB-S2 support combining the previously defined architecture with a wide rotation engine according to embodiments of the present invention.
Figure 14:
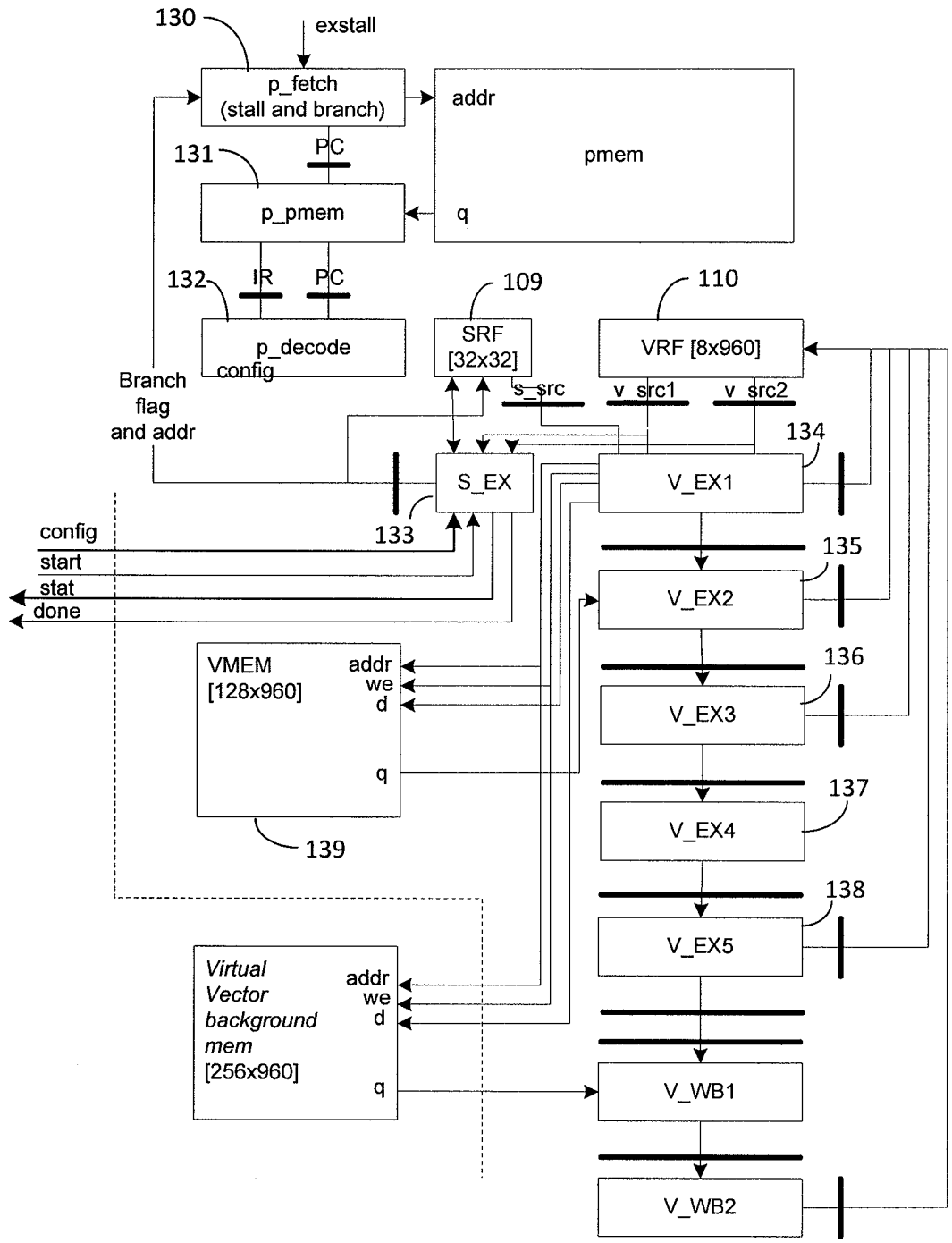
FIG. 14 is a bloc-schematic illustration of the decoder core architecture according to embodiments of the present invention.

The advantage of the architecture described in FIG. 13, relies on the fact that the P cores can be used separately in case turbo and/or LDPC modes need to be decoded that require less parallelism than offered with the complete architecture.

Since the complexity of the crossbars 103, 104 (also called shufflers) is exponentially increasing with the number of ports, the solution to have P times a 96 shuffler plus a rotation engine 120 over all slots is less expensive (both in power as area) compared to a fully flexible (Px96)-way shuffler (not illustrated).

Datapath

The architecture according to embodiments of the present invention comprises four major parts. First, the processing unit where a configurable amount of parallel processing in a SIMD-based scheme can be applied. Secondly, the APP (A Posteriori Probability) BN (bit node) message memory, also referred to as background memory, which has to be accessed in an interleaved way. Thirdly, the interleaver and deinterleaver to align the APP messages stored in the APP memory. In case of architecture-aware codes, e.g. architecture aware LDPC codes, the interleaving can be performed by simple shift operations, given that the memory word width is sensibly chosen in such a way that no overlapping of memory words or sub-words over sub-block borders occurs. In order to perform the interleaving, the structure of the parity-check matrix must be known. Therefore, a memory initialized with the characteristics of a certain code is available to retrieve the interleaving pattern from. Finally, besides the APP messages, the CN messages need to be stored for each CN.

Unified Instruction Set

After having investigated the algorithms to decode the codes, e.g. LDPC codes and turbo codes, in floatingpoint and their robustness against fixed-point effects, a choice can be made on which approximations have proven to be feasible to implement. Having made this decision, the basic instruction set needed for decoding the codes can be derived. A unified instruction set for both turbo codes and LDPC codes is summarized in the table hereinbelow.

The shown instruction set is suitable for all proposed approximations for decoding LDPC codes, since their major differences invoke only a few instructions.

| SIMD instructions | |
|---|---|
| add, sub | basic arithmetic operations |
| and, or, xor | basic logic operations |
| lsr, lsl | logical shift right/left |
| asr, asl | arithmetical shift right/left |
| abs | extract magnitude from message |
| min | compute minimum of two messages |
| min+ | compute running minimum and sign of message |
| cs | compare and select operation |
| max* | impl. of log. of sum of exponential functions |

| vector instructions | |
|---|---|
| vrr, vrl | vector rotate right/left |
| vpack | pack check node messages in SIMD word |
| vunpack | extract check node message from SIMD word |
| vld, vst | load/store a SIMD word from/to memory |
| vldm, vstm | load/store a SIMD word with modulo addressing |
| vpush, vpop | store/load a SIMD word to/from stack |

| scalar instructions | |
|---|---|
| sadd, ssub | basic arithmetic operations |
| sand, sor, sxor | basic logic operations |

| scalar instructions | |
|---|---|
| bz, bnz | conditional jumps (branch zero/branch not zero) |
| jmp | unconditional jump |
| sld, sldi | scalar load/load immediate |

General Purpose SIMD Instructions

Basic arithmetical and logical operations have been added to enable basic data manipulation. No multiplications are provided a priori. The only way to perform normalization, whether on received messages from the channel or on messages after processing, is hence by using the shift operations.

Memory Access Vector Instructions

The instructions interfacing with the memory are in contrast to all other instructions vector instructions. They are manipulating the SIMD word as one vector. They are tagged with the prefix v. All other instructions are operating on each element of the SIMD word individually.

The vpack and vunpack instruction are used to compress and uncompress check node messages of one check node. The vrl and vrr operation are used for interleaving of SIMD words before writing them back to the APP bit node message storage. The packed check node messages can be transferred to and from the check node memory by employing the vst/vld or vstm/vldm instructions.

For state metrics and intermediate storage of messages, a stack-based memory access scheme is proposed with the vpush and vpop instruction, which could also be implemented making use of the vst and vld instructions, respectively.

Special SIMD Instructions

The core operations used to compute the different metrics are quite similar for turbo codes and LDPC codes. The main operation used in turbo codes is the max*-operation, which could also be used for decoding LDPC codes. Besides, a special instruction for efficiently dealing with the signs and magnitudes of messages, namely the min+instruction, is proposed for decoding LDPC codes with the min-sum algorithm. This min+instruction should keep track of the current sign and the current smallest magnitude, to be computed in the forward and backward recursion at each state.

The cs or compare-select operation is proposed as a special instruction for the optimized min-sum approximation. It is used to find and keep track of the two smallest magnitudes when computing the forward recursion. Due to similarities between the min+ and the cs operation, some resources or computational effort could be saved by combining these two instructions.

Scalar Control Instructions

Conditional and unconditional jumps as well as basic scalar arithmetical and logical operations are also provided. They are intended to be used for flow control and indexing purposes, respectively. A scalar register file with a minimum word width of for example 12 bits has to be foreseen, in order to be able to index all message positions. All scalar instructions are tagged with the prefix s.

Pseudo Code

Listing 4.1: Pseudo code to demonstrate intended usage of instruction set.

```
1    ;; --- SCALAR registers ---
2    ;; r1....nr. of bit nodes in current check
3    ;; r2....addr. to check node msg. storages for sub-block
4    ;; r3....sub-block base address in app memory
5    ;; r4....offset in current sub-block
```

-continued

Listing 4.1: Pseudo code to demonstrate intended usage of instruction set.

```
 6    ;; r5....intermediate constant
 7    ;; r8....offset in code specification mem. to data
 8    ;;           of current sub-block
 9
10    ;; --- VECTOR registers ---
11    ;; v0....bit node msg.
12    ;; v1....check node msg.
13    ;; v2....app msg.
14    ;; v3...running max* value
15
16    ;; --- Pseudo code ---
17
18    ;; initialization
19       sld r1,CODEBASE:(r8)   ; load nr. of checks of sub-block
20       sldi r1,#0x0000        ; cnt. to keep track of recursion
21       sldi r5,#0x0001        ; intermediate value
22
23    ;; forward recursion
24 FW:
25       vld v1,0(r2)+          ; load check node msg.
26       vldm v2,0r3:(r4)+      ; load APP msg.
27       sub v0,v2,v1           ; compute bit node msg.
28       vpush @s0,v0           ; save bit node msg. for bw-rec
29       vpush @s1,v10          ; save last result from max* instr.
30       max* v3,v0             ; perform max* approx. on new input
31
32       ssub r1,r1,r5          ; check if recursion is finished
33       bnz FW,r1
```

In the listing above, a small pseudo code snippet is depicted to illustrate the intended use of the instruction set according to embodiments of the present invention. The operands are specified in such a way that the target of the operation is always stated first. The instruction add v3,v1,v2 results in the arithmetical operation v3:=v1+v2.

Beginning with line 19, some exemplary initialization takes place, where the number of check nodes of the current block-row is read from the code specification memory, with the offset to the current mode and standard specified by CODEBASE. The scalar register r8 holds the offset to the current block-row.

The sldi instruction loads a immediate value to the specified register.

The SIMD load instruction vld implements a register-indirect memory addressing scheme, where the address to read from is stored in register r2. An increment is performed after the read operation. For retrieving the data from the APP message storage, an offset-register-indirect addressing scheme is proposed. See Line 26 in the above listing, were the base address is specified in r3, and the index to the individual message is taken from r4. A post-increment with modulo-overflow is performed on r4, after the memory access. A special register has to be provided to specify the sub-block dimension, in order to perform the modulo operation.

Decoder Core

The decoder core 101, in embodiments of the present invention, is implemented as a 64-bit very long instruction word (VLIW) ASIP with a scalar slot 109 and a 96-issue vector slot 110. The scalar slot 109 is associated with a 32×32-bit scalar registerfile (SRF) and the vector slot 110 with a 8×960-bit (96×10) vector registerfile (VRF).

The ASIP 101 is pipelined with a number of stages, up to 10 in the depicted example. The three first stages (p_fetch 130, p_pmem 131 and p_decode 132) take care of instruction fetch, instruction decoding and control flow (branch processing and handling of the external stall signal—extstall). Scalar operations and write back are handled in a single scalar execution stage 133 (S_EX). In the vector slot, vector registerfile 110 read and writeback are pipelined to reduce the critical path. Vector operations are handled with 1 to 5 stages 134, 135, 136, 137, 138 (V_EX1, V_EX2, V_EX3, V_EX4, V_EX5) depending on the instructions. Most vector arithmetics are handled with two stages (execute and writeback). The q-equation instruction (for LDPC decoding according to [M. M. Mansour and N. R. Shanbhab, "Memory-efficient turbo decoder architectures for LDPC codes", IEEE Workshop on Signal Processing Syst. 2002, SIPS '02, pages 159-164, October 2002], which is incorporated herein by reference) is pipelined in 7 stages. Read operation from the background memory structure 102 (including address translation) may require 7-stage delay. To minimize the number of vector registers 110, which multiplexing belongs to the most critical paths, a tightly coupled 128-entries 960-bit wide vector memory 139 may be added (2-cycle access latency). Key application specific instructions are vmaxstar and vminsum which are used in the kernel of both LDPC and turbo decoding. The SIMD processing is using virtual linear addressing, made possible through the shuffler 103, 104 and rotation engine blocks 120, which can perform permutations on the data stored within the background memory banks 102. Selection of the words within the memory banks 102 and shuffle control is made possible through the rAGU 105. In case of decoding methods such as for example LDPC requiring a high parallelization (like in DVB), a rotation engine 120 connecting all processor cores, allowing a cyclic rotation of data from all background memory banks 102 towards the aligned scratchpads 117, is present. In other cases, the shuffler 103, 104 may be used to permute the data within each N-slot processor.

Datapath and Memory Architecture Proposal

According to embodiments of the present invention, by keeping the central processing units flexible, by means of implementing their functionality as an ASIP with very dedicated instructions, different decoding approaches and methods can be deployed on the same hardware.

According to embodiments of the present invention, not only the main data path is shared for decoding different classes of codes (codes which are different in underlying coding principle, such as for example LDPC and turbo codes), but also the major parts of the message storage are shared. Therefore, in an aspect of the present invention, a unified architecture for multiple FEC schemes is provided.

For LDPC codes, it is clear that one has to go for a layered decoding scheme, since the disadvantage of restricting the decoder to a sub-class of LDPC codes is far outweighed by the advantages gained by applying this scheme. Two communication standards have been investigated (IEEE 802.11n, IEEE 802.16e) and enable efficient decoding in a layered way, hence the restriction does not seem to become a major problem for future implementations.

The layered scheme also allows splitting the parity-check matrix of the LDPC code into smaller sub-codes, which enables parallel processing of smaller portions of the code and multi-layer memory storage. This also opens possibilities for parallel metric computation when decoding turbo codes.

Simulation results have shown, that an internal message representation with a word length of 8 bits is enough, to deliver near-optimum performance, when applying the min-sum based approach. For the max*-based approach, at least 10 bits are required. Similar results can be shown for turbo codes, whereby this word length seems to be a feasible trade-off between decoding performance and memory occupation. Reducing the word length also implies a gain in energy efficiency.

For the data path and memory organization, the discussion will now focus on LDPC codes. The generalization of the architecture to also cover turbo codes, will not be discussed in detail hereinafter, but lies within the skills of a person skilled in the art. Nevertheless, some indications will be given on which changes are necessary at the architectural level, in order to allow efficient mapping of decoding kernels for turbo codes.

Architecture Overview

Figure 16:
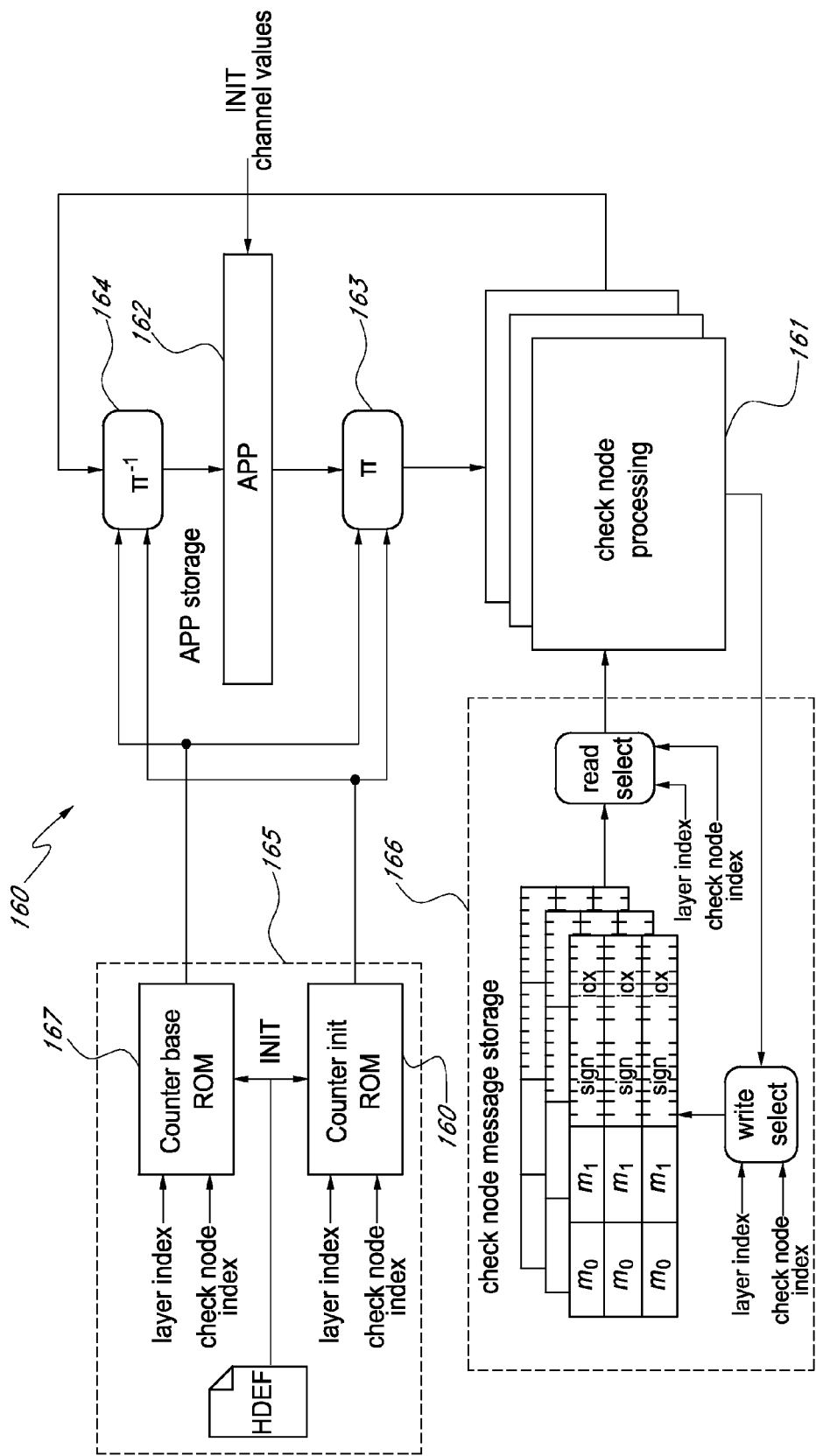
FIG. 16 illustrates data flow and memory organization for efficient decoding of LDPC-codes when using an optimized min-sum approximation.

A top level LDPC decoder architecture 160 is depicted in FIG. 16. The processing is organized in a check-node-centric way, where bit nodes are reduced to message storage and all computations take place in the check node processing unit.

The architecture 160 comprises five major parts:
1. The processing unit 161, where a configurable amount of parallel processing in a SIMD-based scheme can be applied.
2. The APP bit node message memory 162. Accesses to this memory 162 have to be performed in an interleaved way.
3. The interleaver 163 and deinterleaver 164 to align the APP messages stored in the APP memory 162. Interleaving is done by address generators.
4. In order to perform the interleaving, the structure of the parity-check matrix must be known. Therefore, a memory 165 initialized with the characteristics of a certain code is also provided to retrieve the interleaving pattern from.
5. The check node message storage 166 to keep track of all check node messages.

Hereinafter, these parts of the architecture will be highlighted in more detail, starting with the memory organization.

Memory Organization

APP Memory Access Interleaving

The interleavers are a part of the check-node-centric LDPC decoder architecture. An effective interleaving pattern must be found to ensure conflict free memory accesses.

The interleaver 163 and deinterleaver 164, as depicted in FIG. 16, are denoted π and π−1, respectively. The interleavers/de-interleavers 163, 164 are explicitly shown as functional blocks, although their operation will be covered by the check node processing unit 161. How the interleaving can be performed to allow a SIMD-based processing approach, is shown based on two exemplary setups.

INTERLEAVING EXAMPLE I

Figure 17:
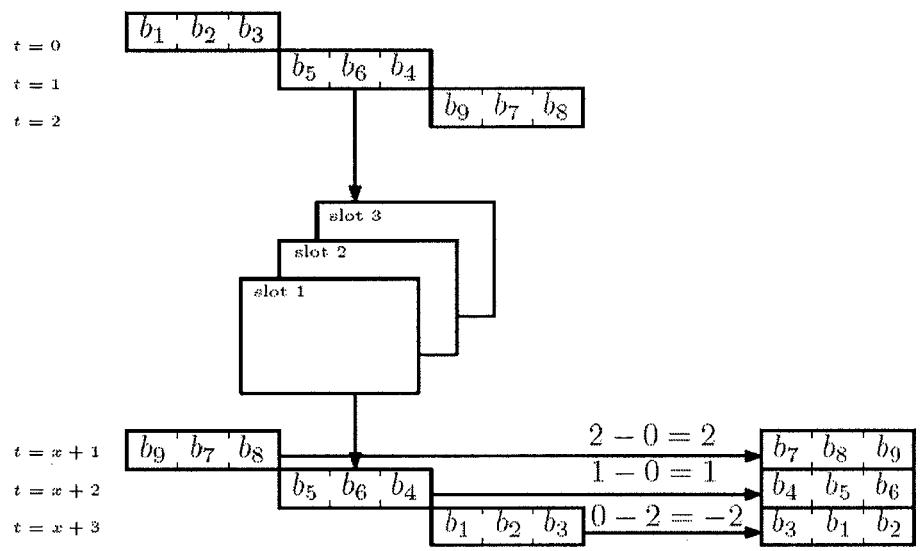
FIG. 17 illustrates an interleaving pattern for example I, where in part a, an exemplary architecture-aware parity-check matrix is shown, in b, the cyclic permutation pattern for this matrix and in c, the message organization for reading and writing is shown, when exploiting the inherent parallelism of the code.

In FIG. 17, a possible interleaving scheme is depicted, where at part a, an exemplary parity-check matrix with a sub-block width of Z=3 is shown. Each block-row consists of four sub-blocks and three block-rows are drawn. In part c, the compressed definition of the paritycheck matrix HAA is denoted as HDEF, where the cyclic permutation of the identity matrix is specified for each sub-block.

Assume that Z messages can be stored in one memory word, this means for this simplified example, three messages are concatenated to form one word. Also assume that the SIMD check node processing unit has three slots and can therewith process three messages from independent check equations per process.

As defined by the parity-check matrix, the first check node needs the messages from bit node 1, 5 and 9, the second check node processes the messages from bit node 2, 6, and 7, and so on. The first, second and third check node will be assigned to the first, second and third slot of the SIMD unit. For the first computation process, to fill one SIMD data word, the messages from bit node 1, 2 and 3 have to be transferred to the processing unit in that order. Assume that the messages stored in the APP memory are already in the correct order, so that for each memory access, one processing step can be performed. For the second SIMD operation, the messages from bit node 5, 6 and 4 have to be transferred to the slots processing check node 1, 2 and 3, respectively.

After having processed all bit node messages of the check equations in that layer, the forward iteration is finished and the backward iteration can start. After each computation process in the backward recursion, one output SIMD word is produced. Due to the nature of the backward recursion, the results delivered in reversed order than they were processed in the forward recursion. In this first example, where Z parallel computation slots are available, interleaving and write back of the output SIMD words can start immediately after each output word was computed. To align the updated APP message of each bit node, in order to be able to efficiently read it when decoding the next layer, its position in the SIMD word has to be adapted.

This is done by rotating each SIMD word by the offset difference between the cyclic permutation index of the sub-block at this layer and the cyclic permutation index of the sub-block in the next layer. As an example, for the first sub-block in layer one, its permutation index is zero, meaning that the bit nodes participating in the check nodes of this layer, are following the pattern of an identity' matrix. For the next layer, the same bit nodes are participating according to a shifted version of the identity matrix, where the shift value is two. So, to arrange the bit node messages of the first sub-block in order to enable efficient reading in the next layer, it must be rotated by 0−2=−2 before writing it back. A positive value means a rotation to the right, whereas a negative value means a rotation to the left.

For the scenario depicted in FIG. 17 the inherent parallelism was exploited, which results in an efficient reading, processing, interleaving and write back flow. It might not always be the case that the inherent parallelism is fully exploited, for instance if the data path width gets too wide, or if the throughput requirements can be met with less parallelism. In that case, the interleaving introduces a significant overhead in terms of delay, as illustrated in the next example.

INTERLEAVING EXAMPLE II

Figure 18:
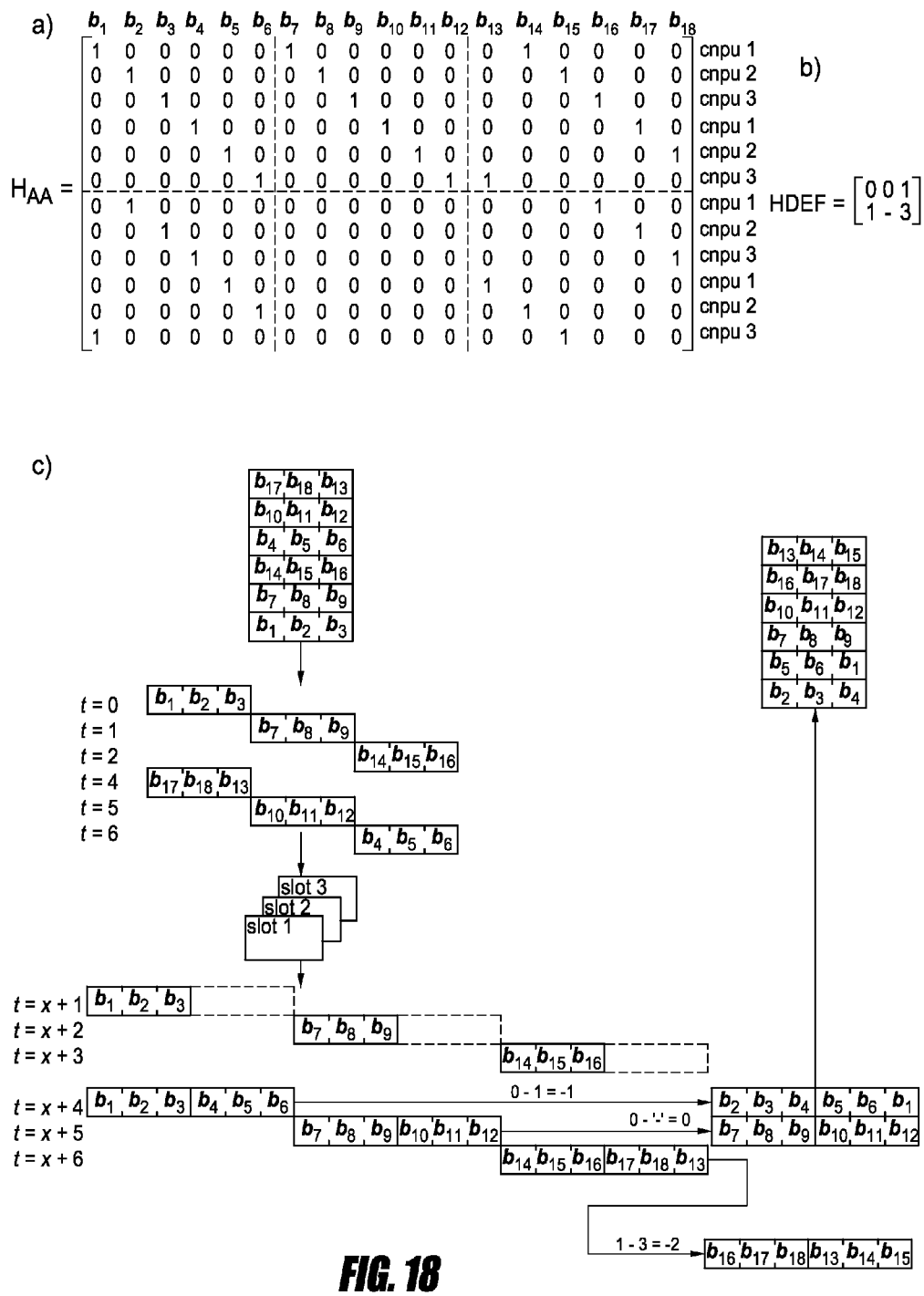
FIG. 18 illustrates an interleaving pattern for example II, where in part a, an exemplary architecture-aware parity-check matrix is shown, in b, the cyclic permutation pattern for this matrix and in c, the message organization for reading and writing, when not exploiting the inherent parallelism of the code.

Consider a parity-check matrix as depicted in FIG. 18, where the sub-block size Z=6 and three sub-blocks are arranged as one block-row. In the example, two block-rows are shown, with their permutation indexes summarized in part b of the figure. Now, instead of exploiting the inherent parallelism of six, only three processing slots are deployed. One memory word again holds three messages and therewith forms a complete SIMD word. As a consequence, decoding of one layer is done in two processes, first for the check equations one to three and afterwards for the check equations 4 until 6.

Assume the words in the memory are already organized in such a way, that the read words can already be used as input data for the SIMD processing unit. After three processing steps, the first three check node equations have been processed in the forward recursion and while producing the outputs in the backward recursion, the next three input messages, for check node 4 until 6, can be fetched from the memory. This procedure is depicted in FIG. 18 as part c.

What turns out to be the main bottleneck of this scenario is that before the results from the first decoding round, namely the results of check ode 1, 2 and 3, can be written back to the memory, the results of all six check nodes in this layer need to be available. This is illustrated in FIG. 18, as the dashed place holder for the results of the remaining three check nodes.

After the arrival of all output messages updated by this layer, interleaving by performing rotations can be performed and the rearranged SIMD words, suitable for being read when decoding the next layer, can be written back to the APP message storage.

Code Specification Memory

As the parity-check matrix is fully specified by the set of cyclic rotations to perform on the identity matrix with dimension Z×Z, this is the only information needed to be stored by the decoder architecture to have full knowledge about the interconnections between bit nodes and check nodes for a given standard. As indicated in FIG. 16, this data is stored in two logical parts of a Read-Only Memory (ROM). In the first part, called the counter base ROM 167, parameters like the sub-block dimensions Z, the number of layers and the block length are stored. Additionally, in the counter init ROM 168, a cyclic rotation value for each sub-block and its position in the parity-check matrix is stored. With the rotation index and the position of the sub-blocks in the parity-check matrix, the actual index of a bit node in the data block can be computed. The bit node index for each bit node in one sub-block, can be computed by taking a modulo-counter, initialized by the value specified in the counter init ROM 168 and adding the offset value for the current subblock.

Figure 19:
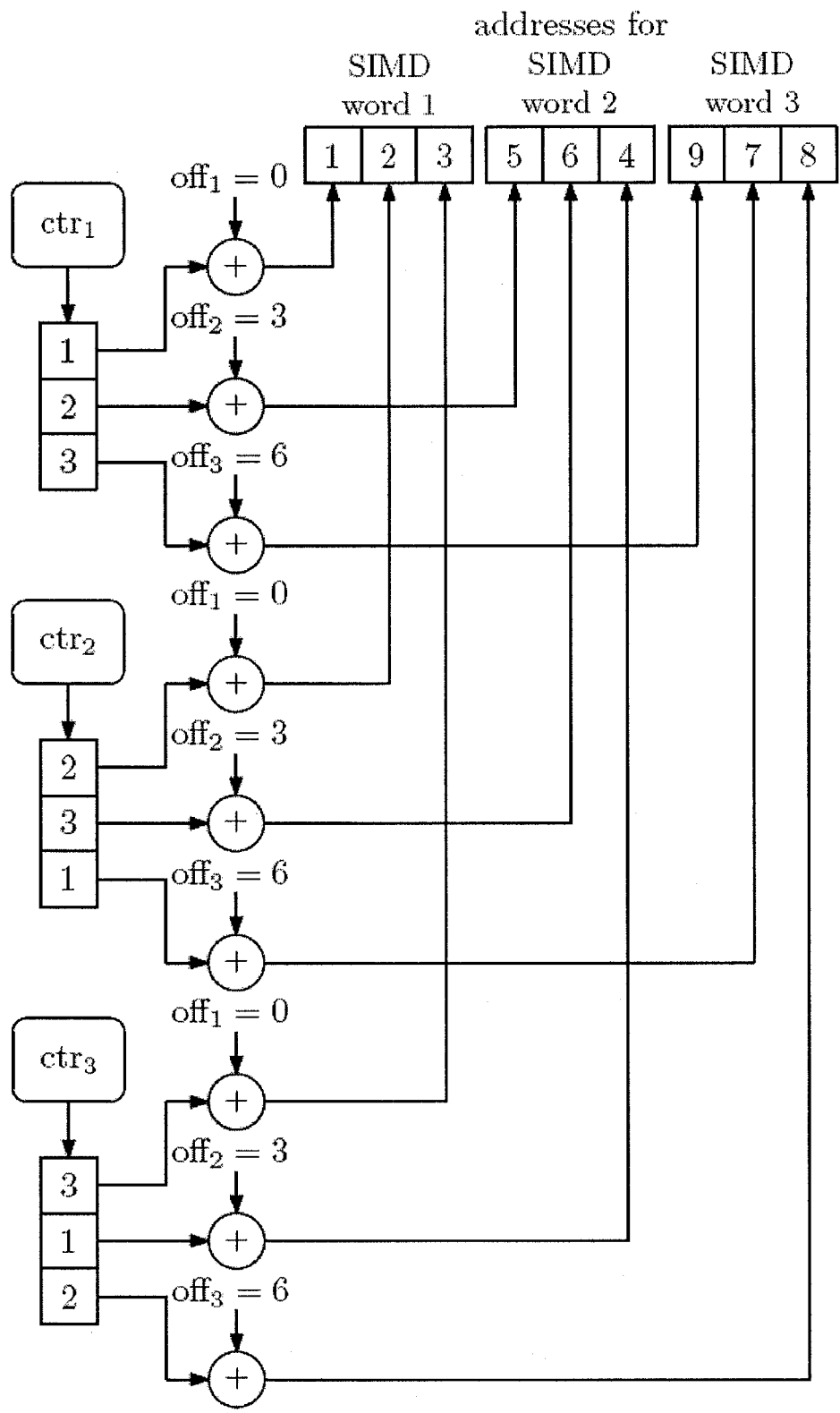
FIG. 19 illustrates a counter arrangement to allow efficient SIMD mapping of interleaved APP messages.

An exemplary arrangement of such modulo-counters to compute the bit node indexes to the APP message storage for the interleaving example I, as detailed before and depicted in FIG. 17, is shown in FIG. 19.

Check Node Message Storage

The APP message storage 162 is initialized with the received channel values.

These APP of each bit node is updated with a more accurate estimation after each sub-iteration. In addition to the APP messages, every check node message, computed by the check node processing unit, must be stored for each sub-iteration. This means for each check node in one layer, dc messages need to be stored. In case of the (1944,972)-irregular LDPC code standardized in the IEEE 802.11n standard, where the average check node degree is 7, 6966 8-bit messages need to be stored. When assuming the 8-bit, quantization of internal messages from previous simulation results is chosen. Due to the irregularity of the check node degree, the number of messages to be stored for each check node is varying.

Figure 20:
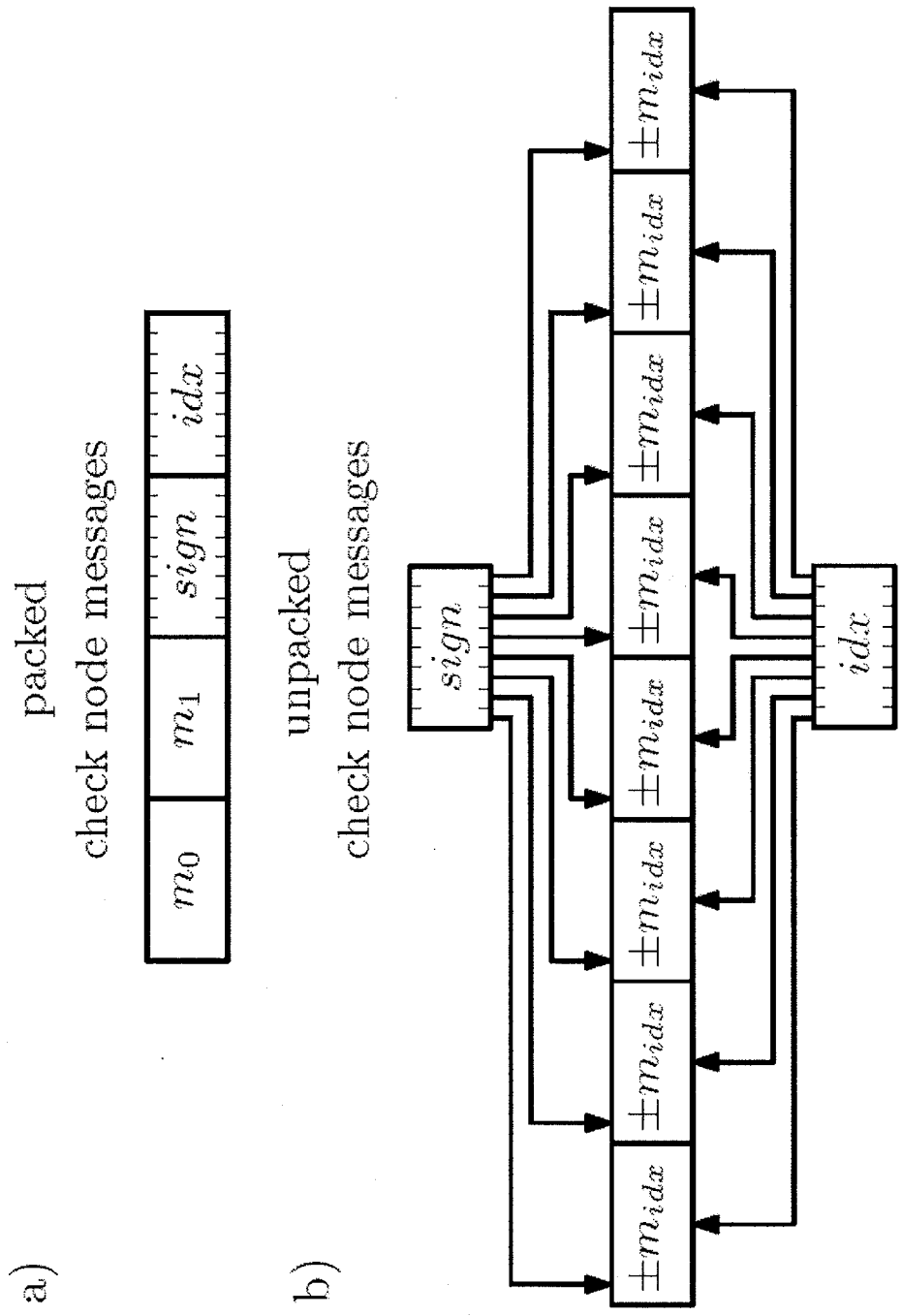
FIG. 20 illustrates an efficient check node to bit node message storage. In a), the messages of one check node are shown in packed form. In b), the unpacked form is depicted.

To reduce the number of messages to store, the optimized min-sum approximation has been introduced. When this scheme is applied, per check node and per layer, only two 8-bit magnitudes need to be stored. This is enabled by storing the check node messages in a compressed way. The composition of an example of a packed vector is depicted in FIG. 20 in part a. Two magnitudes, the smallest and the second smallest one are stored in one word. It is to be noted that these values are unsigned values and thus two additional bits can be saved.

Besides the magnitudes of the messages, track must be kept of which magnitude belongs to which individual check node message. There are only two magnitudes to choose from, therewith only one bit per message is needed.

The same applies to the sign of the message, which also needs to be stored to reproduce a specific message. How the unpacking of messages can be done, is depicted in part b of FIG. 20. Coming back to the example of the (1944,972)-irregular LDPC code, where the check node degree is either 7 or 8, this results in a maximum word length needed to store all check node messages of one check node in direct form of 8×8 bit=64 bits. When storing the messages in packed form, for one check node 2×7 bits for the magnitudes+8×1 bit for signs+8×1 bit for indexes=30 bits are needed. Which offers the use of a bit width of 32 bits. When comparing the check node storage requirement in packed and in direct form, assuming that no alignment needs to be preserved when storing the messages in the direct form, the memory requirement for the example LDPC code can be reduced by more than 2k of 8-bit bytes, when making use of the optimized scheme. This is a memory footprint reduction of around 30%.

Data Path

Check Node Processing

Figure 21:
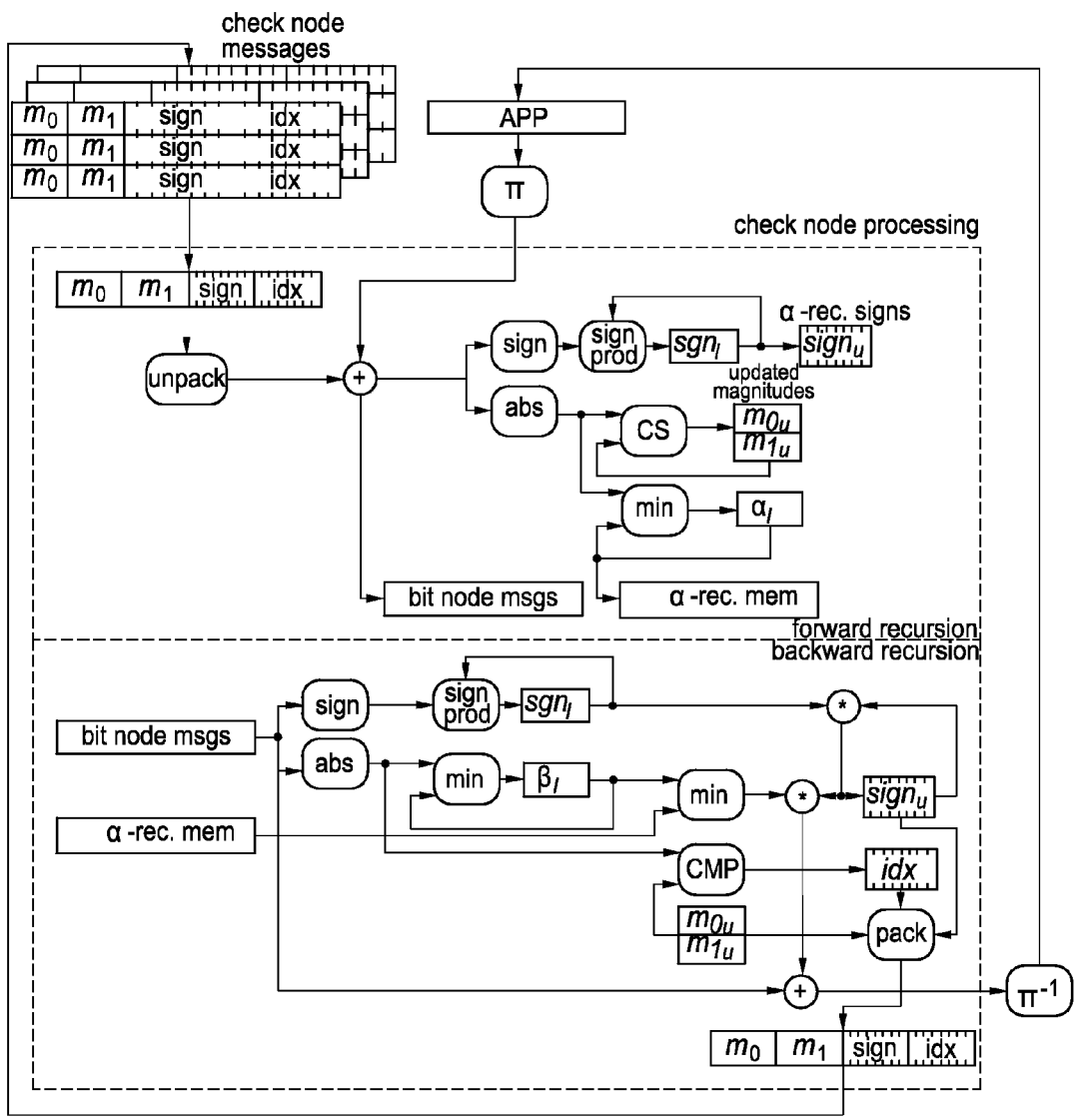
FIG. 21 illustrates a check node processing unit. Computation is split up in two stages. First, the forward recursion computes the signs and magnitudes of the check node messages in forward direction. Additionally, the two smallest values are stored. In the second stage, the backward and output recursion are performed.

The detailed data path of a check node processing unit, as introduced in the top level view in FIG. 16, is depicted in FIG. 21 and will be discussed hereafter. Based on the representative fixed structure when applying the min-sum approximation in combination with the forward-/backward algorithm, a flexible unified instruction set architecture according to embodiments of the present invention is motivated.

Therefore, first the computation of one check node is discussed based on FIG. 21.

Forward Recursion

For the computation of one check node, two iterations are involved. In the first process, the forward recursion, a new value can be computed for each incoming APP message, see FIG. 21. Therefore, the following operations are necessary: to get the bit to check node message which is the basis for all computations in the check node, the check node message from the previous iteration stored in packed form, needs to be subtracted from the APP message. This computed bit node message is stored in an intermediate buffer to avoid re-computation of the values in the backward recursion. From the bit node message, the sign is extracted and multiplied with a running product of bit node message signs. The current state of the running product, before it got updated with the current input message, is stored in an intermediate buffer, which will be used in the backward recursion. A similar procedure is applied to the magnitude of the bit node message, where the minimum of all considered bit node messages until now, held in the $\alpha l$ register, is stored in the a recursion memory. The magnitude of the current message is checked against the current smallest magnitude, in the $\alpha l$ register. If the incoming magnitude is smaller than the stored one, the value in the $\alpha l$ register is replaced. These operations on the sign and magnitude of the bit node messages are combined in the min+ instruction of the proposed instruction set. The CS-operation is in parallel comparing the magnitude of the input messages against a local storage, where the two smallest magnitudes are being stored. The CS-operation also updates the local storage, if an incoming message contains a smaller magnitude than the stored ones. The cs-operation is also available as a single instruction to minimize arithmetic operations and conditional jumps during computation of the forward recursion.

Backward and Output Recursion

After the forward recursion, all signs and minima's at each state of the computation are available in the $sign_u$ and $\alpha$ recursion memory, respectively. Now, in the backward recursion, this information is used to compute on the one hand, the updated APP messages for every bit node having a direct connection to this check node and on the other hand, to compute and pack all check node messages, used to produce the bit node messages in the next iteration. The bit node messages, the $\alpha$ recursion messages and the $sign_u$ messages produced in the forward recursion are now consumed in the backward recursion in a stack-based manner where the last produced value is consumed first. Again, the sign of each considered message is multiplied with a running product of signs and the smallest magnitude for all messages considered before this process of the recursion, is held in the local register $\beta_1$. With the magnitude and sign captured at each state during the forward recursion, combined with the magnitude and sign computed in the backward recursion ($\beta_1$ and sign$_1$), an output message can be computed.

The sign storage sign$_u$ used to capture the intermediate states of the signs in the forward recursion can now be used to store the signs of the output check node messages. The signs from the forward recursion, which have already been considered, can be overwritten. For every output check node message, it also has to be remembered, whether its magnitude is equal to the overall smallest one, or the second smallest one. This information is stored in the idx buffer. After finishing the backward recursion, the check node messages used to generate the updated output APP messages, are represented by the updated buffers sign$_u$, idx and the storage of the updated smallest magnitudes $m_0$ and $m_1$. Before the check node messages are stored in the appropriate check node message memory entry, they get packed into a single word, as depicted in FIG. 20.

Unified Architecture

All operations performed by this representative check node processing unit, are reflected in the proposed instruction set given above. By having this instruction set available, the above kernels can efficiently be implemented in software. In addition to an register file to store intermediate results, two local stack-based storage buffers for the bit node and a recursion messages are needed.

Due to the independent, identical computations performed in each check node in one layer, a SIMD-based computation of multiple check nodes is possible. Then, each instruction is operating on messages from independent check nodes in parallel. Where some special instructions, namely all vector instructions, are operating on the whole SIMD word to enable loading, storing and interleaving of SIMD words. Due to the varying sub-block dimensions (between 24 and 96 in the investigated standards) for different standards and codes, the exploitable parallelism is also varying.

When a fixed SIMD word width is assumed, not all slots of the SIMD processing unit can always be occupied, when decoding different modes of a communication standard. For example, when a SIMD word width of 27 is implemented and a code from the IEEE 802.16e standard with a sub-block width of 24 is decoded, 3 slots can not be used during processing. Every slot is operating on a different check node equation, hence free slots can not be used to allow faster computations of an individual check node.

For the proposed interleaving scheme, some further restrictions regarding the APP memory word width must be taken into account. To be compliant to a plurality of decoding methods, e.g. both investigated standards, with a given SIMD word width, the memory architecture needs to make sure that the input SIMD words can efficiently be loaded and stored. The interleaving is aligned on sub-block borders and depending on the current mode (sub-block width), the memory words of messages from different sub-blocks must not overlap. This means that when the sub-block width is for example 32, 32 messages have to be loaded for one decoding process. If the memory word is for instance 28 messages wide, which would make sense for a different mode, no proper alignment of messages from different sub-blocks is possible. As a result, messages must either be collected from different memory words, where certain positions need to be masked, or some storage positions stay empty. It is to be noted that interleaving before write back can only be done on words with all messages of one sub-block available.

Figure 22:
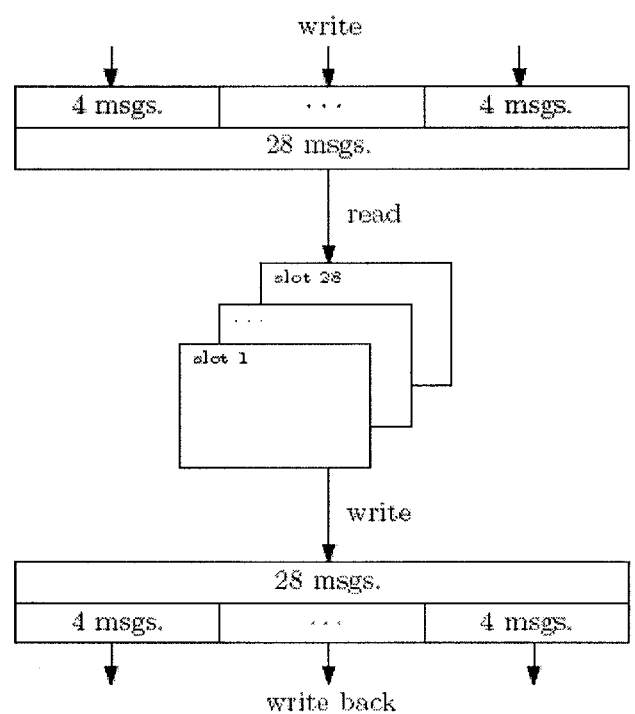
FIG. 22 illustrates an exemplary memory read and write back organization.

In embodiments of the present invention, a restricting standard such as the IEEE 802.16e standard could be used, where subblock sizes are standardized in intervals of 4. This results in possible subblock sizes of 24, 28, 32, ..., 96. To enable aligned storage of messages, the maximum message word width is four messages. To build a SIMD word, when for instance 28 parallel slots are available, 7 read operations are necessary. In case multiple read ports are available, the number of read cycles can further be reduced. A possible memory hierarchy for this example is depicted in FIG. 22. There, the 28 messages are composed of the 7 memory words. Once all memory words have been read from the memory, the SIMD word can be passed to the processing unit. Its output is a SIMD word containing 28 messages, which can be split up again for write back.

If in other standards not all modes of the IEEE 802.16e standard are mandatory to be supported, a wider memory word width could be used. When for instance only modes in an interval of 8 are supported, the memory width could also be increased to 8 messages per memory word.

Another embodiment relates to a system wherein the foregoing embodiments of a method are at least partly implemented, or in other words, to a system adapted for performing the foregoing embodiments of a method. An exemplary system includes at least one programmable processor coupled to a memory subsystem that includes at least one form of memory, e.g., RAM, ROM, and so forth. A storage subsystem may be included that has at least one disk drive and/or CD-ROM drive and/or DVD drive. In some implementations, a display system, a keyboard, and a pointing device may be included as part of a user interface subsystem to provide for a user to manually input information. Ports for inputting and outputting data also may be included. More elements such as network connections, interfaces to various devices, and so forth, may be included. The various elements of the system may be coupled in various ways, including via a bus subsystem for simplicity as a single bus, but will be understood to those in the art to include a system of at least one bus. The memory of the memory subsystem may at some time hold part or all of a set of instructions that when executed on the system implement the processe(s) of the method embodiments described herein.

It is to be noted that the processor or processors may be a general purpose, or a special purpose processor, and may be for inclusion in a device, e.g., a chip that has other components that perform other functions. Thus, one or more aspects of the present invention can be implemented in digital electronic circuitry, or in computer hardware, firmware, software, or in combinations of them. Furthermore, aspects of the invention can be implemented in a computer program product stored in a computer-readable medium for execution by a programmable processor. Method steps of aspects of the invention may be performed by a programmable processor executing instructions to perform functions of those aspects of the invention, e.g., by operating on input data and generating output data. Accordingly, the embodiment includes a computer program product which provides the functionality of any of the methods described above when executed on a computing device. Further, the embodiment includes a data carrier such as for example a CD-ROM or a diskette which stores the computer product in a machine-readable form and which executes at least one of the methods described above when executed on a computing device.

The foregoing description details certain embodiments of the invention. It will be appreciated, however, that no matter how detailed the foregoing may appear in text, the invention may be practiced in many ways. It should be noted that the use of particular terminology when describing certain features or aspects of the invention should not be taken to imply that the terminology is being re-defined herein to be restricted to include any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A computer based automated method of exploring data decoding methods for allowing selection, for each of the decoding methods, of one approximation and scheduling of data accesses to a memory structure, changed codes of each of the decoding methods by one or more fixed point approximations making use of a pre-defined instruction set being available, wherein at least one of the data decoding methods requires data shuffling operations on the data, the method comprising:
   loading at least two decoding methods;
   loading a template of an application specific instruction set processor (ASIP) device having a memory structure and an ASIP core with a pre-defined instruction set; and
   computing a performance of an execution of each of the approximations on the device, the performance including throughput and power consumption by the ASIP core and power consumption due to data accesses to the memory structure.

2. The method according to claim 1, wherein the approximations comprise arithmetic operations excluding multiplication, division, and power.

3. The method according to claim 2, wherein the arithmetic operations comprise instructions selected from the group of max, min, sum, and subtraction.

4. The method according to claim 1, wherein the method further comprises exploring different templates of the ASIP device.

5. A computer based automated method of exploring decoding methods and an instruction set suitable therefor to allow selection for each of the decoding methods one approximation and a corresponding instruction set, changed codes of each of the decoding methods by a plurality of fixed point approximations making use of the instruction sets being available, the method comprising:
   loading at least two decoding methods;
   loading a template of an application specific instruction set processor (ASIP) device with a plurality of possible instruction sets; and
   computing the performance of the execution of each of the approximations on the device, the corresponding instruction set being the same for the at least two decoding methods,
   wherein the method is performed by a computer.

6. A non-transitory computer readable medium having stored therein a program which, when executed by a computer, performs an instruction set delivered by a method according to claim 5.

7. The computer readable medium according to claim 6, wherein the instruction set comprises arithmetic operators excluding multiplication, division and power.

8. The computer readable medium according to claim 6, wherein the arithmetic operators comprise any of max* or min sum.

9. A system for executing a decoding method, the system being capable of executing at least two data decoding methods which are different in underlying coding principle, wherein at least one of the data decoding methods requires data shuffling operations on the data, the system comprising:
   at least one application specific instruction set processor (ASIP) core having an instruction set comprising arithmetic operators excluding multiplication, division and power, the ASIP core configured to execute approximations of each of the at least two data decoding methods;
   at least a first memory unit configured to store data;
   a transfer unit configured to transfer data from the first memory unit towards the at least one ASIP core, the transfer unit comprising a data shuffler; and
   a controller configured to control the data shuffler independent from the ASIP core.

10. The system according to claim 9, wherein the at least two different data decoding methods comprise low-density parity-check (LDPC) codes.

11. The system according to claim 9, wherein the at least two different data decoding methods comprise turbo decoding.

12. The system according to claim 9, comprising a plurality of ASIP cores.

13. The system according to claim 9, wherein the transfer unit further comprises a data rotation engine.

14. The system according to claim 9, wherein the ASIP core is adapted so that the at least two different data decoding methods use the same datapath.

15. A method of decoding data using a programmable ASIP core and a memory structure, comprising:
   loading an approximation of a decoding method onto a programmable application specific instruction set processor (ASIP) core;
   loading coded data; and
   decoding the data by the approximation, wherein decoding the data comprises executing arithmetic operations on the coded data by the programmable ASIP core and controlling scheduling of data accesses to a memory structure by a controller separate form the ASIP core, wherein controlling scheduling of data accesses comprises controlling data shuffling from the memory structure by a controller separate from the ASIP core.

16. The method according to claim 15, wherein decoding the data comprises executing arithmetic operations on the coded data by a plurality of parallel ASIP cores.

17. The method according to claim 15, wherein the controller is adapted for controlling data accesses so as to be collision-free.

18. The method according to claim 15, wherein the method is performed by one or more computing devices.

19. A non-transitory computer readable medium having stored therein a program which, when executed by a computer, performs a method according to claim 15.

20. A system for executing a decoding method, the system being capable of executing at least two data decoding methods which are different in underlying coding principle, wherein at least one of the data decoding methods requires data shuffling operations on the data, the system comprising:
   means for executing approximations of each of the at least two data decoding methods, the executing means comprising an instruction set comprising arithmetic operators excluding multiplication, division and power;
   means for storing data;

means for transferring data from the storing means towards the executing means, the transferring means comprising a data shuffler; and means for controlling the data shuffler independent from the executing means.

\* \* \* \* \*

UNITED STATES PATENT AND TRADEMARK OFFICE
CERTIFICATE OF CORRECTION

PATENT NO. : 8,578,238 B2
APPLICATION NO. : 12/752944
DATED : November 5, 2013
INVENTOR(S) : Priewasser et al.

It is certified that error appears in the above-identified patent and that said Letters Patent is hereby corrected as shown below:

On the Title Page
Page 2 (item 56, Other Publications) at column 2, line 13, change "GLOBCOM" to --GLOBECOM--.

In the Specification
In column 9 at line 47 (approx.), change "max*(x,y)=log($e^x$+$e^y$)=max(x,y)+log(1+$e^{-|x-y|}$)" to $$\text{--} \max{}^*(x,y) = \log(e^x + e^y) = \max(x,y) + \log\left(1 + e^{-|x-y|}\right) \text{--}.$$

In column 10 at line 35 (approx.), change "(1)" to --Eq. (1)--.
In column 13 at line 8, change "ill." to --IL--.
In column 17 at line 57, change "10" to --IO--.
In column 24 at line 26, change "identity'matrix." to --identity matrix.--.
In column 26 at line 39, change "a" to --α--.

Signed and Sealed this
Twenty-seventh Day of May, 2014

Michelle K. Lee
*Deputy Director of the United States Patent and Trademark Office*